(12) United States Patent
Kajita et al.

(10) Patent No.: US 7,579,640 B2
(45) Date of Patent: Aug. 25, 2009

(54) HYBRID MEMORY DEVICE

(75) Inventors: Yoko Kajita, Kanagawa (JP); Ichiro Koiwa, Tokyo (JP); Takao Kanehara, Tokyo (JP); Kinya Ashikaga, Tokyo (JP); Kazuhide Abe, Tokyo (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 490 days.

(21) Appl. No.: 11/228,188

(22) Filed: Sep. 19, 2005

(65) Prior Publication Data
US 2006/0065917 A1 Mar. 30, 2006

(30) Foreign Application Priority Data
Sep. 24, 2004 (JP) ............................. 2004-276507
Jan. 14, 2005 (JP) ............................. 2005-007077

(51) Int. Cl.
*H01L 27/115* (2006.01)
(52) U.S. Cl. .............................. 257/295; 257/E27.104; 257/E21.663
(58) Field of Classification Search ................ 257/295, 257/E27.104, E21.663
See application file for complete search history.

(56) References Cited

U.S. PATENT DOCUMENTS

| | | | |
|---|---|---|---|
| 7,030,435 B2 * | 4/2006 | Gnadinger | 257/295 |
| 7,163,886 B2 * | 1/2007 | Fujiwara et al. | 438/622 |
| 2002/0020868 A1 | 2/2002 | Yang et al. | |
| 2002/0024073 A1 * | 2/2002 | Shimada et al. | 257/295 |
| 2002/0163080 A1 * | 11/2002 | Taniguchi et al. | 257/758 |
| 2003/0006443 A1 | 1/2003 | Yang et al. | |
| 2003/0006553 A1 | 1/2003 | Yang et al. | |
| 2003/0173677 A1 | 9/2003 | Yang et al. | |

FOREIGN PATENT DOCUMENTS

JP 2003-100994 4/2003

OTHER PUBLICATIONS

"Recent Progress in Ferroelectric Memories," pp. 113-125.
Shoichi Masui, "Applications of Ferroelectric Random Access Memory," Recent Progress in Ferroelectric Memories, pp. 112-125.

* cited by examiner

*Primary Examiner*—Jerome Jackson, Jr.
*Assistant Examiner*—Paul A Budd
(74) *Attorney, Agent, or Firm*—Volentine & Whitt, P.L.L.C.

(57) ABSTRACT

A hybrid memory device includes a plurality of regions including a memory cell array region upon which are formed a plurality of memory cells and a logic circuit region upon which is formed a logic circuit device, and is provided with a liner oxide layer formed on a region covering the logic circuit region except the memory cell array region and a cover layer formed on the liner oxide layer while extending to the memory cell array region.

5 Claims, 15 Drawing Sheets

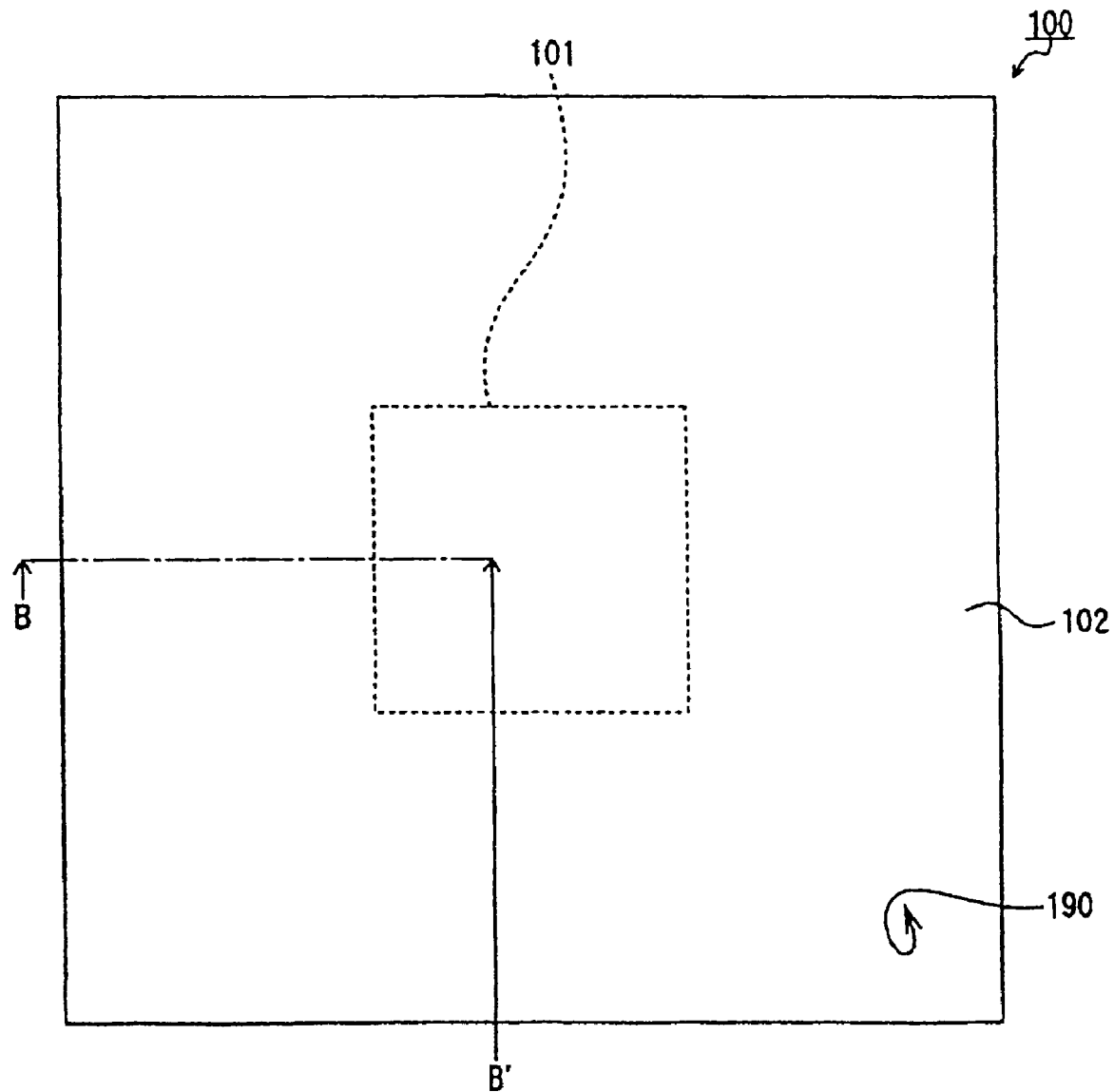
FIG.1A        PRIOR ART

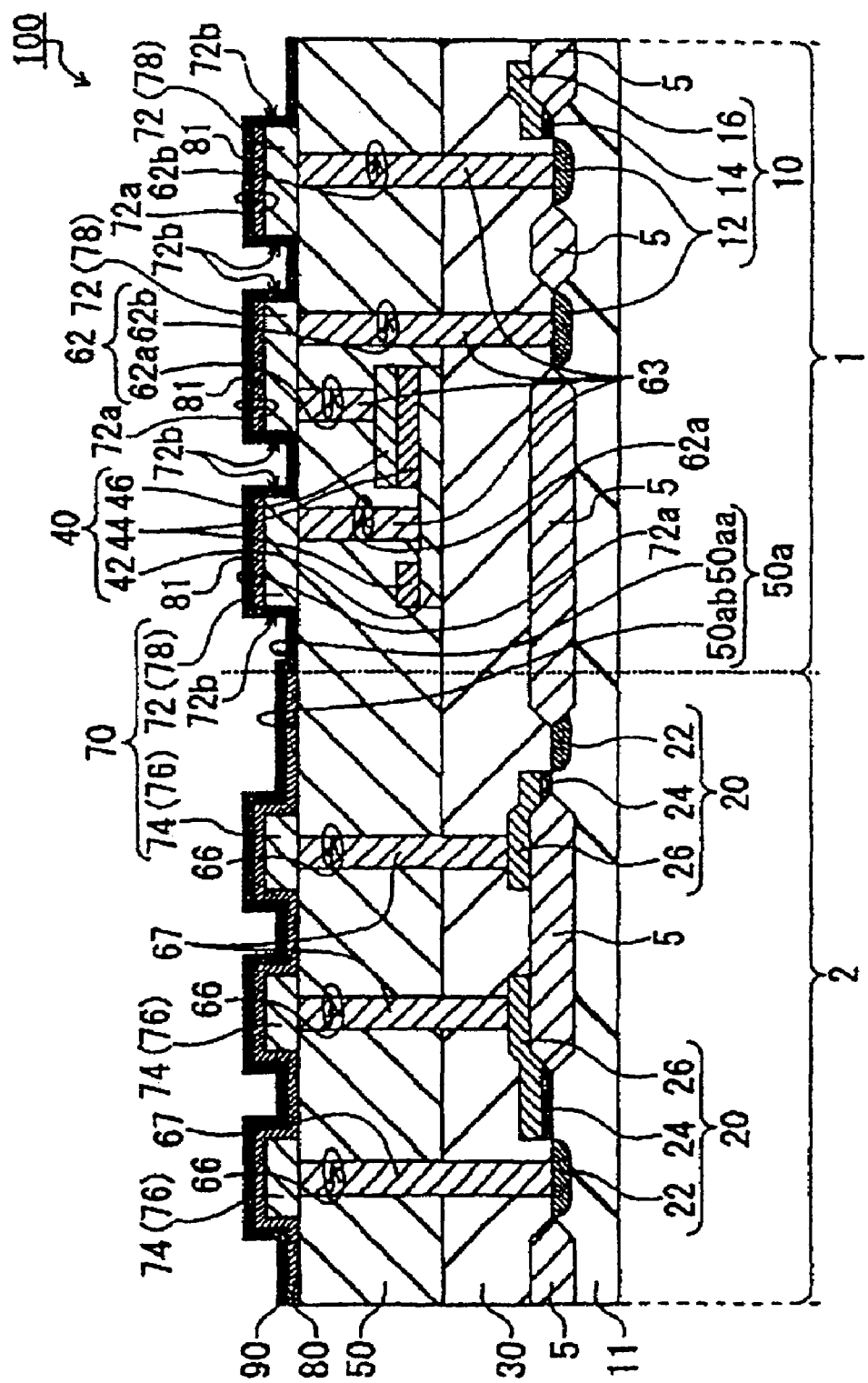

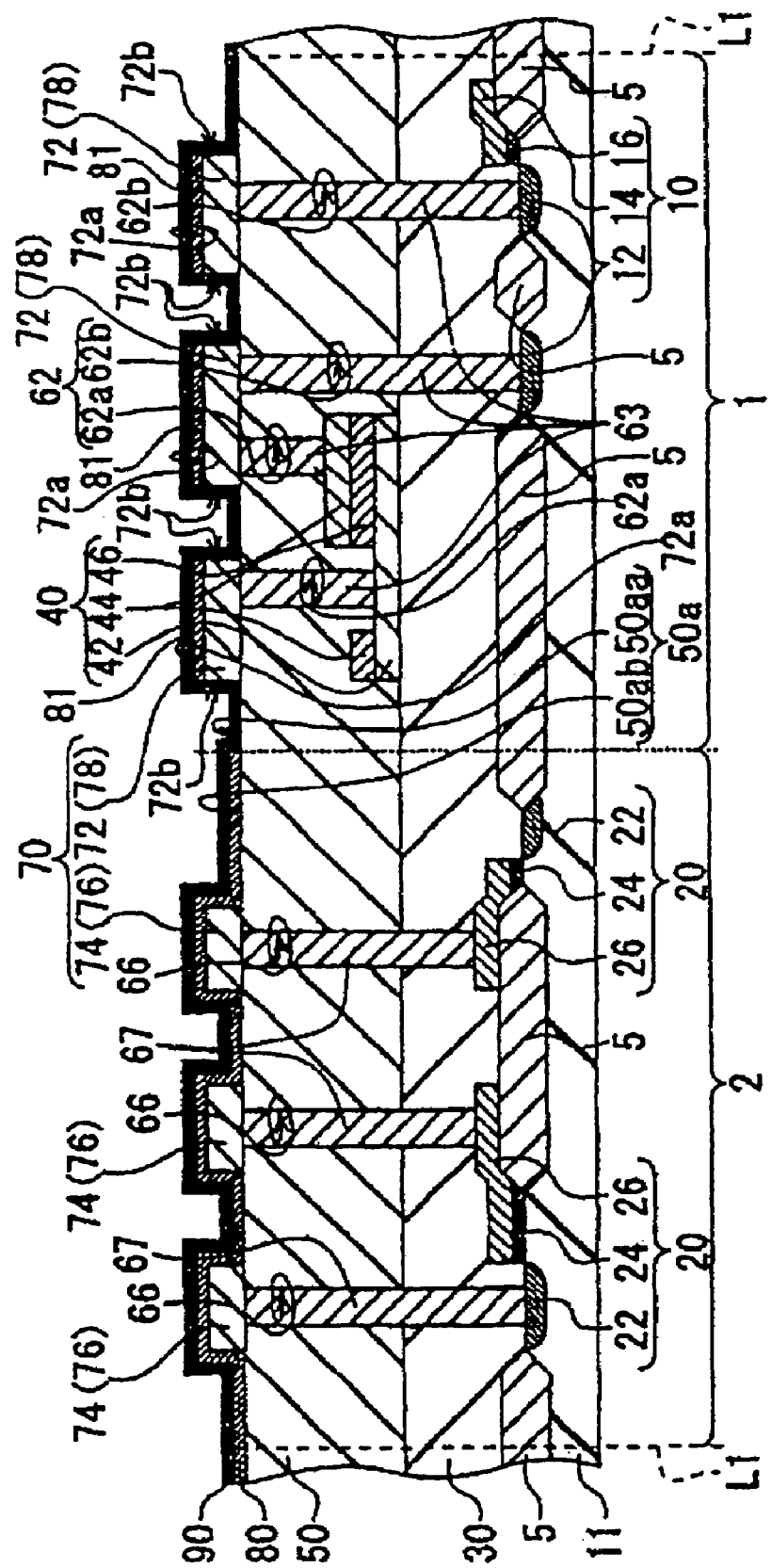

HYBRID MEMORY DEVICE

BACKGROUND OF THE INVENTION

1. Field of the Invention

The present invention relates to a hybrid memory device provided with a memory cell to store binary data as a polarization state of a ferroelectric layer and a method for manufacturing the same.

2. Description of Related Arts

Ferroelectric Random Access Memory (hereinafter referred to as FeRAM) is a representative form of ferroelectric memory.

Recently, as so-called SOC (system on chip) technology has been developed, a hybrid memory device having a structure provided with functions different from those of FeRAM cells, i.e., integrating a logic circuit to perform processes related to the FeRAM cells and an RF circuit or the like into one chip, has been introduced (see pages 112-125 of NEW DEVELOPMENT OF FeRAM, CMC Publication).

A ferroelectric layer incorporated into the above-described FeRAM is formed of an oxygen compound material. The oxygen compound material is reduced by hydrogen ($H_2$) generated from moisture ($H_2O$) formed around the ferroelectric layer, e.g., unavoidably penetrated into a CVD (chemical mechanical deposition) layer. This reduction reaction leads to deterioration in the polarization characteristics of the ferroelectric layer.

For example, a structure having a hydrogen diffusion barrier layer made of aluminum oxide is disclosed in Japanese Patent Laid-Open No. 2002-43541, wherein the hydrogen diffusion barrier layer is formed on a metal wiring layer connected to the ferroelectric layer for the purpose of preventing the hydrogen generated during a passivation process from diffusing into the ferroelectric layer.

In addition, a structure having a moisture diffusion barrier layer made of $Si_3N_4$ covering a top surface and sides of a metal wiring for the purpose of reducing an influence of the hydrogen generated during the formation of a passivation layer is disclosed in Japanese Patent Laid-Open No. 2003-100994.

Using the above-mentioned structures of the Japanese Patents Laid-Open Nos. 2002-43541 and 2003-1009943 the hydrogen (or moisture) diffusion barrier layer made of aluminum oxide or $Si_3N_4$ is directly formed on the metal wiring.

Formation of these barrier layers leads to so-called charge up phenomena, wherein a charge is formed on the metal wiring.

Hereinafter, an additional example of a conventional ferroelectric memory provided with a structure to prevent charge-up is described with reference to the drawings.

FIG. 1 A is an explanatory diagram of the prior art as viewed from the top of a conventional FeRAM. FIG. 1B is an explanatory diagram of the prior art showing a cross-section formed by cutting a plane along the dash dotted line B-B' of FIG. 1A.

The ferroelectric memory 100 is provided with a semiconductor substrate 111. The semiconductor substrate 111 is divided into a memory cell array region 101 and a logic circuit region 102 encompassing the memory cell array region 101.

A memory cell device 110 is formed in the memory cell array region 101. And, a logic circuit device 120 is formed in the logic circuit region 102. These memory cell device 110 and logic circuit device 120 are separated by a field oxide layer 103 formed, for example, by a LOCOS (local oxidation of silicon) method.

The memory cell device 110 is, for example, a device such as a transistor. The memory cell device 110 has, for example, a memory cell diffusion region 112, a memory cell gate insulating layer 114 and a memory cell gate electrode 116 formed on the memory cell gate insulating layer 114 as constituent elements of the transistor.

The logic circuit device 120 is, similar to the memory cell device 110, a device such as a transistor. The logic circuit device 120 has, for example, a logic circuit device diffusion region 122, a logic circuit device gate insulating layer 124 and a logic circuit device gate electrode 126 formed on a logic circuit insulating layer 124 as constituent elements of the transistor.

A first insulating layer 130 is formed in the memory cell array region 101 formed thereon the memory cell device 110 and the logic circuit region 102 formed thereon the logic circuit device 120.

A ferroelectric capacitor structure 140 is disposed on the partial region in the memory cell array region 101 as a region of the first insulating layer 130 is disposed. The ferroelectric capacitor structure 140 has a structure obtained by stacking a bottom electrode 142, a ferroelectric layer 144 and a top electrode 146 in the named order from the side of the semiconductor substrate 111.

The second insulating layer 150 is formed by covering a top surface of the first insulating layer 130 including the ferroelectric capacitor structure 140. Therefore, the second insulating layer is formed over the memory cell region 101 and the logic circuit region 102.

On a surface 150a of the second insulating layer 150, memory cell contact holes 162 extend from a surface portion in the memory cell array region 101 to the ferroelectric capacitor structure 140 is formed. The memory cell contact holes 162 are formed into buried contacts 163 by filling them with a conductive material. Similarly, the memory cell contact holes 162 are formed from the surface 150a of the second insulating layer 150 to the memory cell diffusion region 112 of the memory cell device 110. The memory cell contact holes 162 are formed into the buried contacts 163 by filling them with a conductive material.

In addition, in the surface 150a of the second insulating layer 150, the logic contact holes 166, extending from the surface portion in the logic circuit region 102 to the logic circuit device 120, are formed. The logic circuit contact holes 166 are formed into the logic circuit buried contacts 167 by filling them with a conductive material.

The first wiring unit 172 extends to the partial region in the memory cell array region 101 among the second insulating layer 150. The first wiring unit 172 is electrically connected to the buried contacts 163.

The second wiring unit 174 extends to the partial region in the logic circuit region 102 among the second insulating layer 150. The second wiring unit 174 is electrically connected to the logic circuit buried contact 167. These first and second wiring units 172 and 174 are formed in the same plane as the second insulating layer 150, i.e., the surface 150a, as the wiring layer 170.

The liner oxide layer 180 is disposed so as to cover the memory cell array region 101 and the logic circuit region 102. The liner oxide layer 180 is made of, for example, silicon oxide or NSG (Non-doped Silicate Glass) (hereinafter simply referred to as a P-TEOS layer) formed using TEOS (Tetraethoxysilane) applied by plasma CVD (Chemical Vapor Deposition).

A cover layer 190 is formed on the liner oxide layer 180. The cover layer 190 is, for example, a thin layer of an alumina ($Al_2O_3$).

As previously described above, if the hydrogen (or moisture) diffusion barrier layer is directly formed on the metal wiring, charge up phenomena occur in the metal line. It is possible for this to result in breakdown of the gate oxide layer of the electrically connected transistor through the buried contacts connected to the metal wiring or the like.

That is, if the gate oxide layer becomes like that, for example, the function of the logic circuit device such as memory cell control is broken; and further; the ferroelectric memory malfunctions.

In general, the surface area of the metal wiring formed on the logic circuit region, excluding the memory cell array region, is greater than the surface area (sum of the top surface and side are~) of the first metal wiring (the first wiring layer) formed on the memory cell array region. Therefore, particularly, the breakdown of the gate insulating layer of the transistor due to the charge-up phenomena occurs easily in the logic circuit region.

In the example shown in the drawings, the liner oxide layer is formed in order to prevent such charge-up phenomena before the formation of the cover layer. The liner oxide layer is formed, e.g., by the CVD method, as previously described above.

As described above, moisture is unavoidably trapped in the layer formed by the CVD method. Furthermore, this moisture is dissolved by the heat process, thereby occasionally being converted into hydrogen.

As a result, an annealing process, conducted at a temperature of about 700° C., is essential to prevent the ferroelectric layer from being exposed to any one or both of the moisture and the hydrogen and for the purpose of dehydration and/or dehydrogenation in a prior art.

However, if the annealing process is performed under these conditions, particularly, the electrical characteristics of the transistor formed on a region except for the memory cell array region, i.e., for this example, the logic circuit region, may be changed. In addition, there is a problem that the characteristics of ferroelectric layer are deteriorated.

SUMMARY OF THE INVENTION

The present invention has been made in consideration of the above-described problems in the related art. It is, therefore, an object of the present invention to provide a ferroelectric memory cell array with excellent electrical characteristics at the time of shipping and higher performance and a hybrid memory device including a logic circuit without deterioration of electrical characteristics.

It is another object of the present invention to provide a method for manufacturing a hybrid memory device capable of preventing the deterioration of electrical characteristics of a ferroelectric memory cell array and a logic circuit due to phenomena, such as charge up, occurring during a manufacturing process.

In order to accomplish these objects, the hybrid memory device of the present invention is constructed as will be described hereinafter.

The hybrid memory device includes a memory cell array region. In the memory cell array region, a plurality of memory cells including a ferroelectric layer is formed. Additionally, the hybrid memory device includes a logic circuit region. In the logic circuit region, a logic circuit (device) is formed. The logic circuit described herein is, for example, a circuit to perform operational processes and controls related to the ferroelectric memory cell. In the logic circuit, a decode circuit to control the electrical operation of the ferroelectric memory cell is included.

Furthermore, in the hybrid memory device described herein, a so-called ferroelectric memory consisting of a ferroelectric memory cell array and a logic circuit is included.

The hybrid memory device includes the logic circuit region and has a liner oxide layer covering the entire region excluding the memory cell array region.

A cover layer is formed over the entire top surfaces of the region where the liner oxide layer is formed and the memory cell array region.

In addition, a method for manufacturing a hybrid memory device of the present invention mainly includes processes as described hereinafter.

That is, a plurality of memory cells including a ferroelectric layer is formed in the memory cell array region of the semiconductor substrate in the form of matrix and a logic circuit (device) is formed on the logic region.

An insulating layer is formed so as to cover the entire top surface of the semiconductor substrate including the memory cell array region and logic circuit region.

A liner oxide layer is formed so as to cover a region including the logic circuit region but not including the memory cell region.

A cover layer is formed over the liner oxide layer and the memory cell array region.

In accordance with the construction of the hybrid memory device in accordance with the present invention, as the liner oxide layer is not formed on the memory cell array region, concerns that the ferroelectric layer is slightly deteriorated by the moisture and the hydrogen diffused from such a liner oxide layer are eliminated. Therefore, deterioration of electrical characteristics is drastically eliminated. As a result, a hybrid memory device having higher performance ferroelectric memory cell arrays can be provided.

In addition, since the liner oxide layer is not present in the memory cell array region, the annealing process employed in the prior art, as described above, becomes unnecessary. Therefore, the hybrid memory device having the deteriorated initial characteristics of the ferroelectric memory cell array in response to the formation of the liner oxide layer smaller can be provided. Furthermore, in accordance with the example employing an offset oxide layer, the present invention improves the withstand voltage of the transistor disposed on the memory cell array region while providing the above effect.

In accordance with a manufacturing method of the present hybrid memory device, the present invention prevents the generation of so-called charge-up phenomena at regions excluding the memory cell array region, particularly in the logic circuit region. Therefore, the manufacturing process of the present invention can prevent the breakdown of the logic circuit region, particularly, the gate insulating layer. That is, the deterioration of electrical characteristics such as withstand voltage of the device due to the breakdown of the gate insulating layer can be prevented.

As a result, the yield of the manufactured hybrid memory device is improved. In addition, the degree of freedom in the wiring layout design is improved by not considering the antenna ratio (the area ratio between the cover layer and the gate oxide layer regions). That is, since the wiring design can be optimized, the hybrid memory device provides further improvement in the electric characteristics related to the wiring.

As described above, since it is unnecessary to form the liner oxide layer on the memory cell array region, the annealing process is eliminated. Therefore, the hybrid memory device can be manufactured through a simple process.

Further, according to this manufacturing method, by eliminating the annealing process, there can be prevented the deterioration of the device formed on the logic circuit region due to the annealing process and the deterioration of the ferroelectric layer in the memory cell array region.

BRIEF DESCRIPTION OF THE DRAWINGS

The above and other objects and features of the present invention will become apparent from the following description of the preferred embodiments given in conjunction with the accompanying drawings, in which:

FIG. 1A is an explanatory diagram of a conventional FeRAM as viewed from the top;

FIG. 4B is a schematic view of a cross-section taken along dash dotted line A-A' of FIG. 4A;

FIGS. 6A to 6C are explanatory diagrams of manufacturing processes following FIGS. 5A to 5C.

DETAILED DESCRIPTION OF THE INVENTION

Figure 1B:
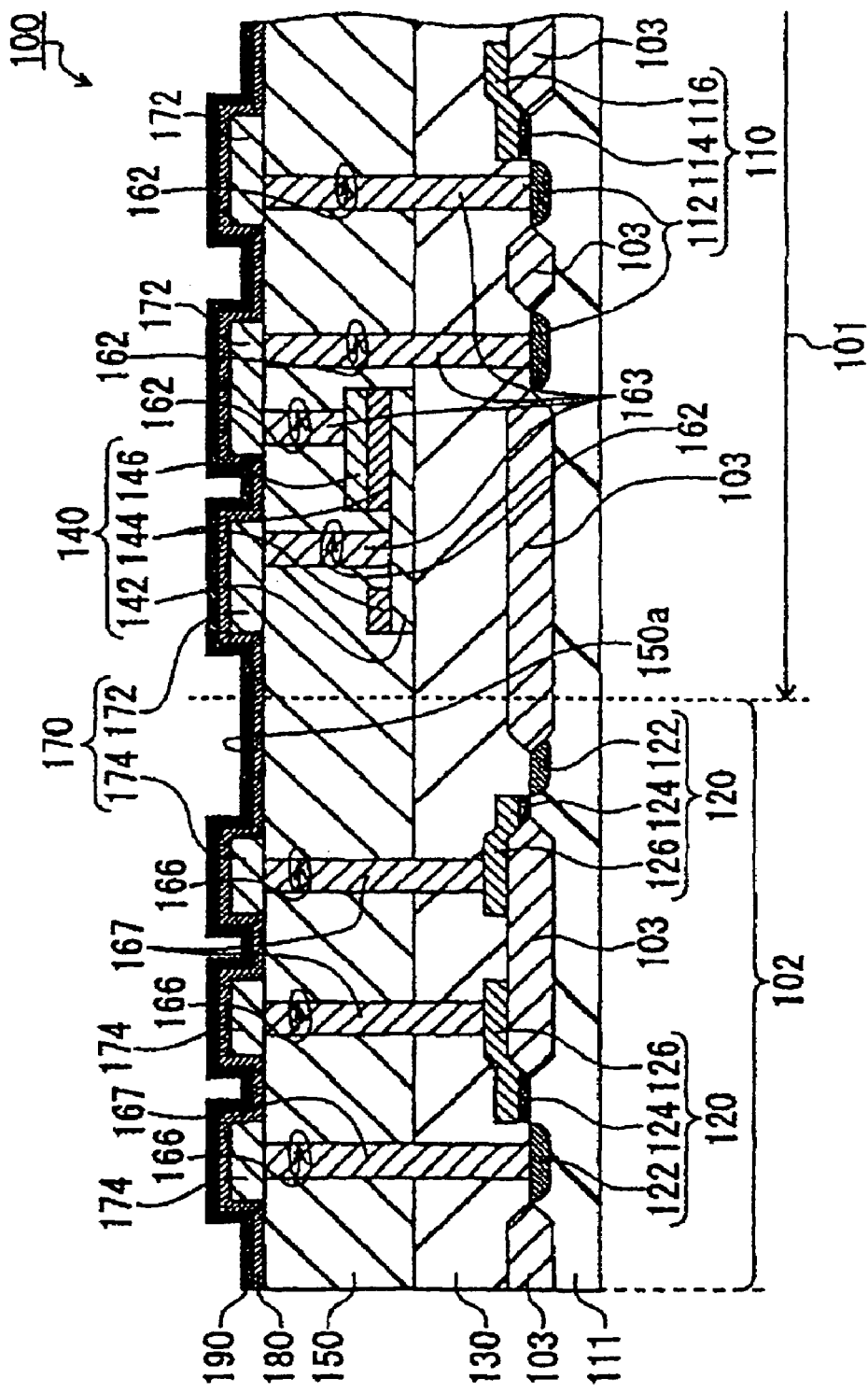
FIG. 1B is an explanatory diagram of the prior art showing the cross-section formed by cutting a plane along dash dotted line B-B' of FIG. 1A.

Hereinafter, embodiments of the present invention will be described in detail with reference to the accompanying drawings. It is to be understood that each of the elements in the drawings is schematically represented only to provide a better understanding of the present invention and the numerical conditions or the like described hereinafter are simply described as an example.

First Embodiment

Construction of the Hybrid Memory Device

Figure 2A:
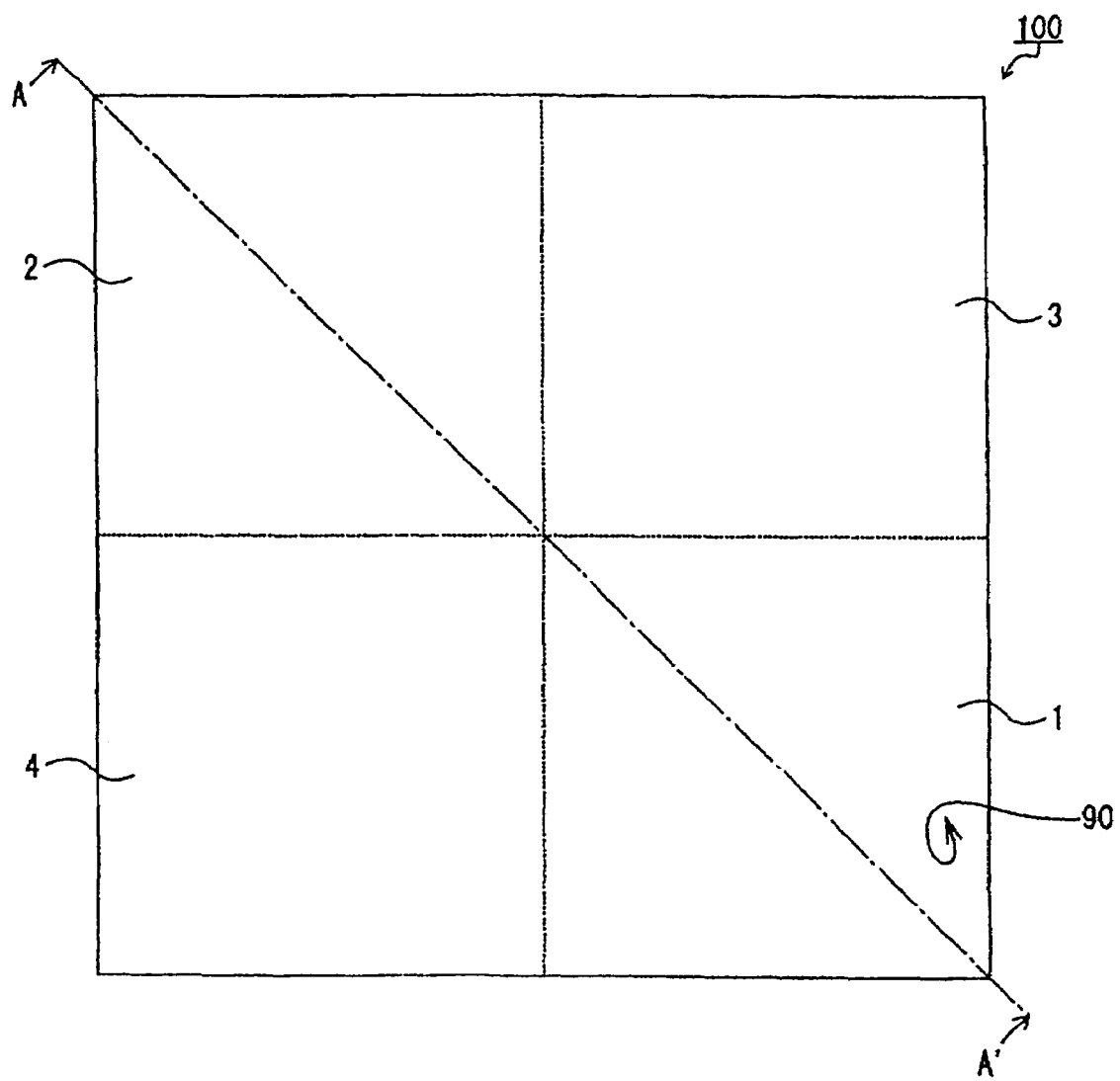
FIG. 2A is a schematic top view explaining elements of an example of a hybrid memory device in accordance with a first embodiment of the present invention.
Figure 2B:
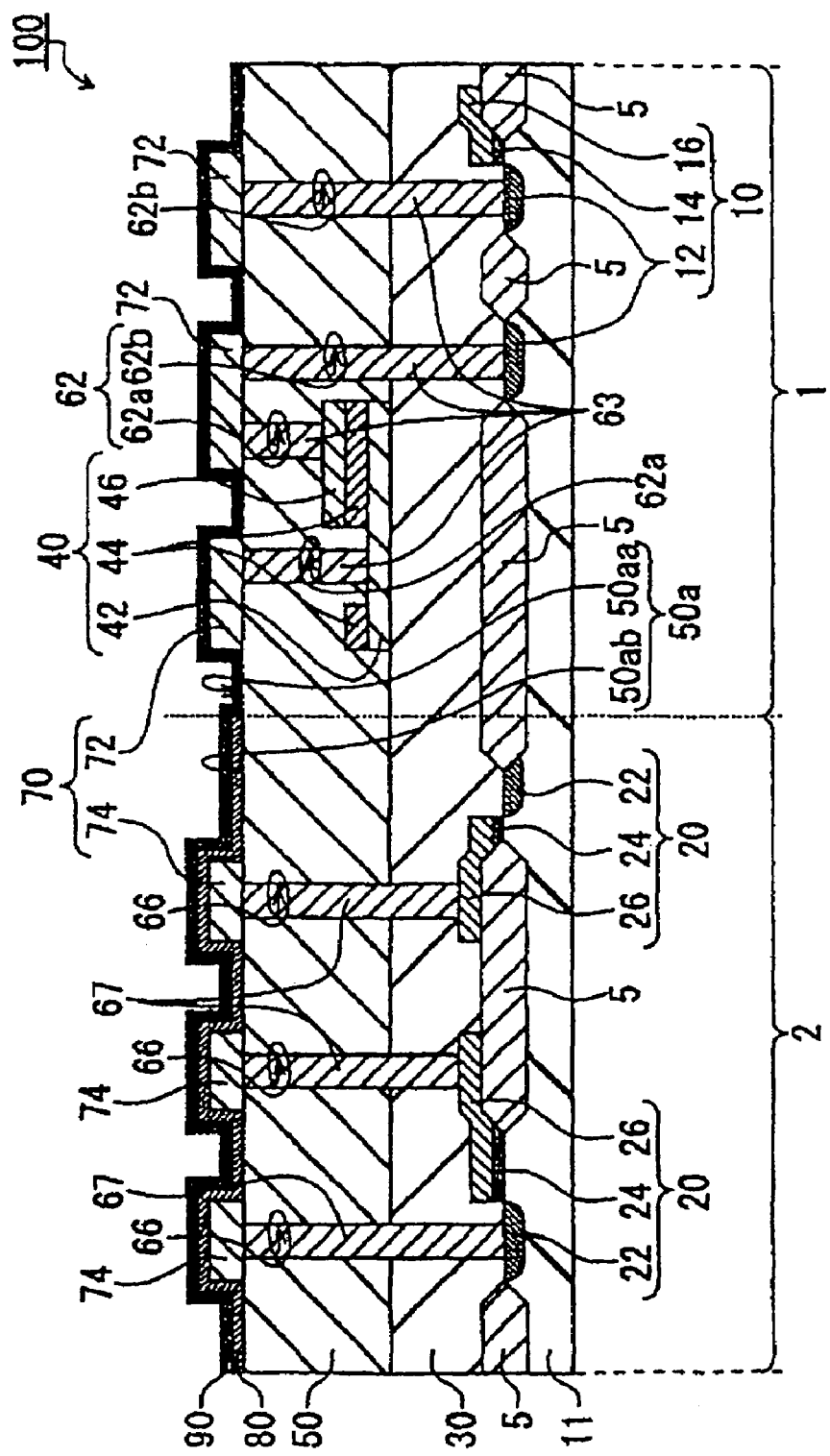
FIG. 2B is a schematic view representing a cross-section taken along dash dotted line A-A' of FIG. 2A.

Referring to FIGS. 2A and 2B, one example of a hybrid memory device of the present invention will be described.

FIG. 2A is a schematic top view explaining elements of an example of a hybrid memory device in accordance with a first embodiment of the present invention. FIG. 2B is a schematic view representing a cross-section taken along dash dotted line A-A' of FIG. 2A.

The hybrid memory device 100 has a feature in a construction of a following liner oxide layer. As for other elements, any suitable elements of a conventional hybrid memory device or a Ferroelectric. Random Access Memory (hereinafter referred to as FeRAM) may be appropriately selected and applied to the present invention.

As shown in FIGS. 2A and 2B, the hybrid memory device 100 of the present invention takes the form of a chip. In this embodiment, the hybrid memory device 100 has a hexahedral shape.

As shown in FIG. 2A, the hybrid memory device 100 is provided with a semiconductor substrate 11 with a plan shape in the form of rectangles. A plurality of regions is defined in the semiconductor substrate 11. In this embodiment, the semiconductor substrate 11 is divided into 4 regions in rectangle. A memory cell array region (first region) 1, a logic region (second region) 2 adjacent to the memory cell array region 1, a third region 3 and a fourth region 4 are divided in the form of a matrix. Since the rectangular division is only an example, the plurality of regions may, for example, be divided into stripes. Therefore, these regions, e.g., the memory cell array region 1 and the logic circuit region 2, may be adjacent to each other, as in this example, or may be separated from one another.

In this specification, the term "region" refers to any three dimensional space bounding an element disposed on the semiconductor substrate 11.

A memory cell device 10 is disposed in the memory cell array region 1. In addition, a logic circuit device 20 is disposed in the logic circuit region 2. The memory cell device and the logic circuit device 20 are separated from each other by a device isolation structure, e.g., a field oxide layer 5, formed by a conventional device isolation process such as LOCOS (Local Oxidation of Silicon) method.

The memory cell array region 1 is adjacent to each of the logic circuit region 2, the third region 3 and the fourth region 4. In these examples, the rectangular memory cell array region 1 is laid out in such a way that the diagonal vertex of the rectangle is adjacent to the vertex of the logic circuit region 2. In addition, the memory cell array region 1 is laid out in such a way that lines of the rectangle are adjacent to lines of the third region 3 and the fourth region 4.

In the memory cell array region 1, a plurality of memory cells including a ferroelectric layer and a memory cell device to be described hereinafter are arranged in the form of matrix.

The memory cell device 10 includes a device such as a transistor having a conventional construction. For example, the memory cell device 10 includes a memory diffusion region 12, a memory cell gate insulating layer (gate oxide layer) 14 and a memory cell gate electrode 16 formed on the memory cell gate insulating layer 14 as elements of the transistor.

For example, the memory diffusion region 12 is an ion diffusion region where suitable ions are implanted under the conventional conditions. For example, the memory cell gate insulating layer 14 is a silicon oxide layer formed by a conventional thermal oxidation process. The memory cell gate electrode 16 is, for example, a conventional metal electrode.

The logic circuit region 2 is positioned adjacent to the memory cell array region 1, the third region 3 and the fourth region 4, respectively. The logic circuit device 20 is formed in the logic circuit region 2.

The logic circuit device 20, similar to the memory cell device 10, includes a device such as a transistor. The logic circuit device 20 includes a decoder circuit or the like, wherein the decoder circuit controls the operation of the memory cell via connection to the memory cell array.

The logic circuit device 20 includes, for example, as elements of a transistor, a logic circuit diffusion region 22, a logic circuit device gate insulating layer 24 and a logic circuit device gate electrode 26 formed on the logic circuit device gate insulating layer 24.

Any suitable devices may be positioned in the third region 3 and the fourth region 4. An input/output (I/O) circuit, an analog circuit, an RF circuit and so called microcomputer are disposed on the third region 3 and the fourth region 4.

In this embodiment, the memory cell array region 1 and the logic circuit region 2 are laid out such that they are adjacent to each other in a direction along the diagonal lines of rectangles dividing the edges of the semiconductor substrate 11, but the present invention is not limited to this configuration.

A first insulating layer 30 is formed on the top of the memory cell array region 1 on which the memory cell device 10 is formed and the top of the logic circuit region 2 on which the logic circuit device 20 is formed. That is, the first insulating layer 30 is disposed on the front and top of the semiconductor substrate 11 where the memory cell device 10 and the logic circuit device 20 are formed. It is preferable that, for example, the first insulating layer 30 be a silicon oxide (hereinafter simply referred to as $O_3$-TEOS) layer grown using ozone ($O_3$) via Plasma Chemical Vapor Deposition (PCVD) using TEOS (Tetraethoxysilane).

On the first insulating layer 30 in the memory cell array region 1, a ferroelectric capacitor structure 40 is disposed. The ferroelectric capacitor structure 40 has a conventional structure. That is, the ferroelectric capacitor structure 40 is provided with a structure in which a bottom electrode 42, a ferroelectric layer 44 and a top electrode 46 are stacked in the named order.

For example, it is preferable that the bottom electrode 42 and the top electrode 46 be made of platinum (Pt) and the ferroelectric layer 44 be made of SBT ($SrBi_2Ta_2O_9$) layer, respectively.

The second insulating layer 50 is formed over the entire surface of the first insulating layer 30 in order to cover the ferroelectric capacitor structure 40. That is, the second insulating layer 50 is formed over the memory cell region 1, the logic circuit region 2, the third region 3 and the fourth region 4. For example, it is preferable that the second insulating layer 50 be a P-TEOS layer.

In the second insulating layer 50, memory cell contact holes 62 (62a: first contact holes, 62b: second contact holes) and logic circuit contact holes 66 are formed.

The first contact holes 62a formed in the memory cell array region 1 are formed from a surface 50a of the second insulating layer 50 to the ferroelectric capacitor structure 40.

Meanwhile, the second contact holes 62b are also formed in the memory cell array region 1 and are extended from the surface 50a of the second insulating layer 50 to the memory cell device 10.

Preferably, the memory cell contact holes 62 (the first and the second contact holes 62a and 62b) are formed into buried contacts 63 by being filled with a conductive material such as tungsten (W). Such buried contacts may also be referred to as a memory cell wiring structure.

The logic circuit contact holes 66 may be referred to as third contact holes. The third contact holes 66 are formed in the logic circuit region 2. The third contact holes 66 are opened from the surface 50a to the logic circuit device 20. The third contact holes 66 are formed into logic circuit buried contacts 67 by being filled with a conductive material such as tungsten. Generally, such logic circuit buried contacts 67 is referred to as a peripheral wiring structure.

In the surface 50a (i.e., the top surface) of the second insulating layer 50 where these buried contact holes 63 and logic circuit buried contacts 67 are formed, a first wiring unit 72 and a second wiring unit 74 are formed as a wiring layer 70.

The first wiring unit 72 extends over a first portion of surface region 50aa in the memory cell array region 1 of the second insulating layer 50. The first wiring unit 72 is electrically connected to the memory cell wiring structure 63.

On the other hand, the second wiring unit 74 extends over a region including a second portion of surface region 50ab in the logic circuit region 2, excluding the first portion of surface region 50aa, that is, the second insulating layer 50 formed on the logic circuit region 2, the third region 3 and the fourth region 4.

The second wiring unit 74 is electrically connected to the logic circuit buried contact 67. These first and the second wiring units 72 and 74 are formed in the same plane of the second insulating layer 50, i.e., the surface 50a, as the wiring layer 70; Also, the first and the second wiring units 72 and 74 are not electrically connected to each other in the wiring layer 70.

For example, it is preferable that the wiring layer 70 be made of a metal wiring such as aluminum (Al), copper (Cu) or the like.

On the logic circuit region 2 where the second wiring unit 74 is formed, a liner oxide layer 80 is formed. The liner oxide layer 80 is formed as a layer pattern covering the second wiring unit 74, i.e., covering the logic circuit region 2, the third region and the fourth region 4, and also opening the memory cell array region 1.

For example, it is preferable that the liner oxide layer 80 be a P-TEOS layer.

Further, a cover layer 90 is formed over the entire top surface of the second insulating layer 50 where the above-described wiring layer 70 (the first wiring unit 72 and the second wiring unit 74) and the liner oxide layer 80 are formed. That is, the cover layer 90 extends from the logic circuit region 2, the third region 3 and the fourth region 4 where the liner oxide layer 80 is formed to the memory cell array region 1 where the first wiring unit 72 is formed. Preferably, a thin layer of alumina ($Al_2O_3$) and silicon nitride (SiN) or the like are employed the cover layer 90.

A multi-layer wiring structure may be formed, wherein the multi-layer wiring structure includes the wiring layer 70 as a first wiring layer, a second wiring layer and a third wiring layer obtained, for example, by forming via holes through both or any one of the liner oxide layer 80 and the cover layer 90 above the first wiring layer 70 and electrically connected to the wiring layer 70. However, since this configuration does not fall within the scope of the present invention, an illustration and detailed explanation thereof are omitted.

In addition, in this embodiment, gate electrodes of a selective transistor corresponding to the memory cell device 10 formed on the memory cell array region 1 is not connected to the first wiring unit 72 of the wiring layer 10. That is, the gate electrodes of the selective transistor connected to the ferroelectric capacitor structure 40 are connected to the first wiring unit 72 by inserting a second wiring layer and a third wiring layer (not shown) located above the wiring layer 70. Specifically, all of the buried contacts 63 connected to the first wiring unit 12 in the memory cell array region 1 are connected to the memory cell diffusion region 12. Accordingly, even if the first wiring unit 72 experiences charge up, the transistor (the memory cell device 10) in the memory cell array region 1 is highly resistant to breakdown of the gate insulating layer in comparison with the transistor (the logic circuit device 20) of the logic circuit region 2 wherein the logic circuit buried contacts 67 are connected to the logic circuit device gate electrodes 26.

In according to these constructions, penetration of hydrogen and moisture generated at oxide layers into the first wiring unit 72 is of no concern since it is not covered with the oxide layers. Therefore, slight deterioration of the ferroelectric layer is prevented. In addition, as described above, since the transistor in the memory cell array region 1 is difficult to make the breakdown of gate insulating layers due to charge up in comparison with the transistor in the logic circuit region 2, it is unnecessary for an oxide layer to be inserted between the first wiring unit 72 and the cover layer 90.

Manufacturing Method of the Hybrid Memory Device

Subsequently, referring to FIGS. 2 and 3, an exemplary method of manufacturing the above-described hybrid memory device 100 will be described.

In addition, in the explanation of the embodiment of the present manufacturing method, to avoid complexity in the drawings, only regions formed upon two adjacent hybrid memory devices, among a plurality of hybrid memory devices formed on a wafer, are described.

In addition, as described above, the hybrid memory device of the present invention features a unique liner insulating layer structure. Therefore, since the manufacturing processes of the present embodiment, except for the process of manufacturing the liner insulating layer, can be similarly implemented by employing the manufacturing processes for a conventional hybrid memory device or ferroelectric memory, a detailed description thereof is omitted.

Figure 3A:
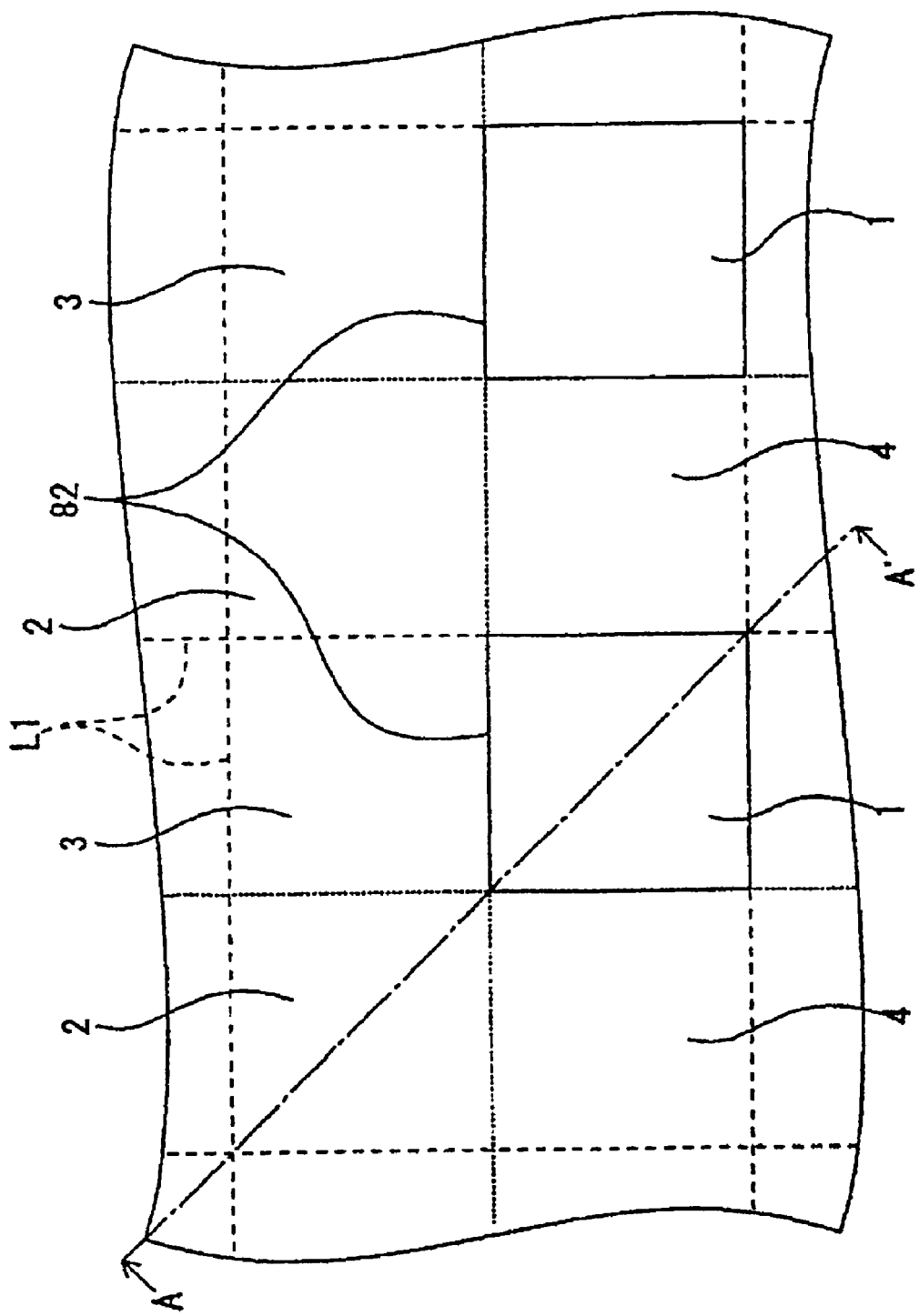
FIG. 3A is a schematic plan view of the hybrid memory device during the manufacturing process at a wafer level.
Figure 3B:
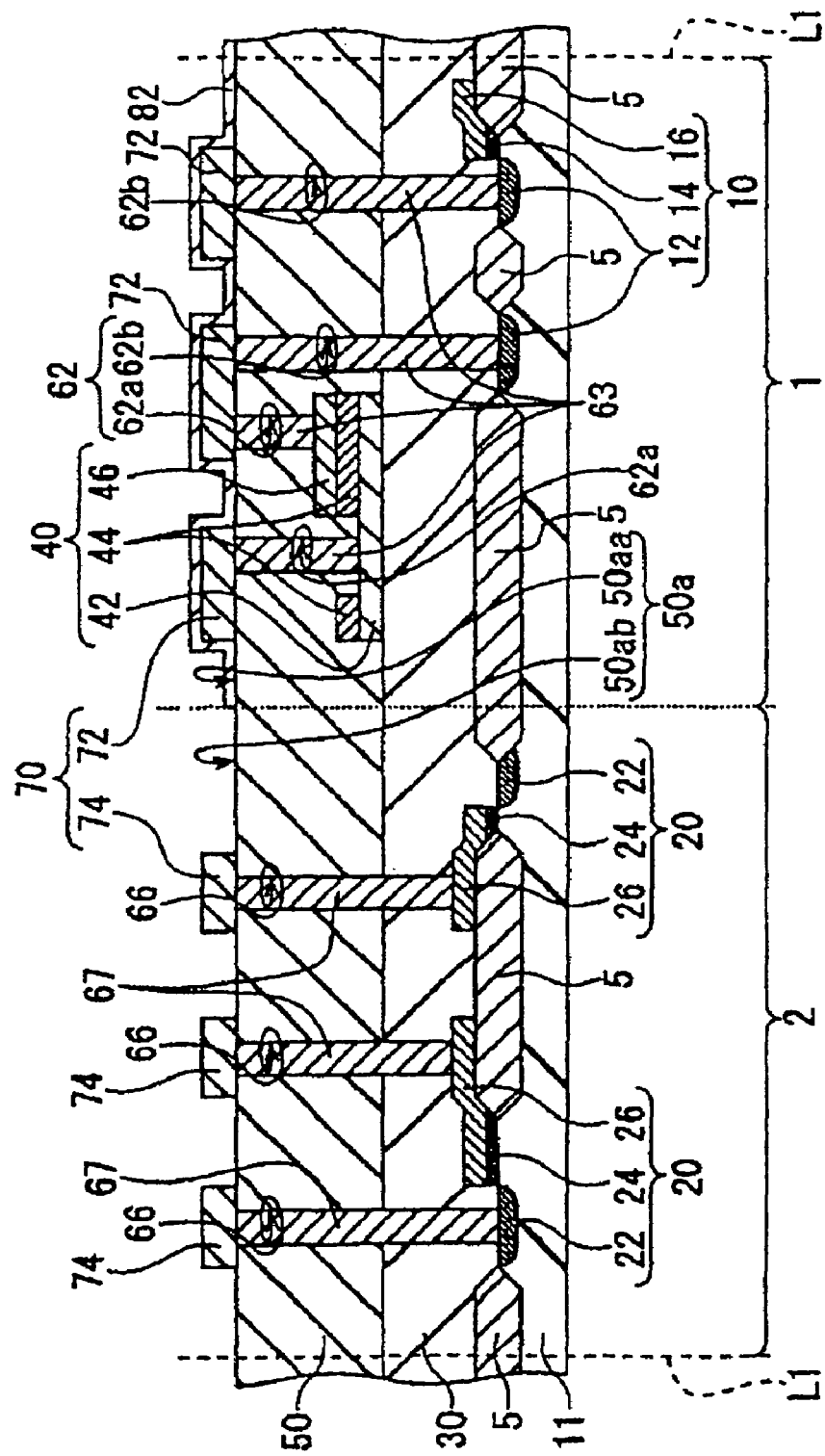
FIG. 3B is a schematic diagram illustrating the cross-section of the hybrid memory device during the manufacturing process at a wafer level taken along dash dotted line A-A' of FIG. 3A.

FIG. 3A is a schematic plan view of the hybrid memory device during the manufacturing process at a wafer level and FIG. 3B is a schematic diagram illustrating the cross-section of the hybrid memory device during the manufacturing process at a wafer level taken along dash dotted line A-A' of FIG. 3A.

Firstly, a plurality of sets is divided into a matrix in the semiconductor substrate (wafer) 11 by forming a memory cell array region 1, a logic circuit region 2, a third region 3 and a fourth region 4 adjacent to the memory cell array region 1 as one set.

In the memory cell array region 1 of the semiconductor substrate 11, a memory cell device 10 is formed according to a conventional wafer process. In addition, in the logic circuit region 2, a logic circuit device 20 is formed according to a conventional wafer process.

Specifically, for example, a field oxide layer 5) i.e., a device isolation structure is formed using the LOCOS method.

Subsequently, the memory cell device 10 including a device such as a transistor, provided with a memory cell diffusion region 12, a memory cell gate insulating layer 14 and a memory cell gate electrode 16 formed on the memory cell gate insulating layer 14, is formed on the memory cell array region 1. In addition, the logic circuit device 20 is formed in a similar fashion on the logic circuit device region at the same time.

In the next step, a first insulating layer 30 is grown on the exposed surface of the semiconductor substrate 11, that is, on the memory cell array region 1 formed thereon the memory cell device 10 and on the logic circuit region 2 formed thereon the logic circuit device 20 as the entire top surface of the semiconductor substrate 11.

Specifically, for example, it is preferable that the growth of $O_3$-TEOS layers be performed by a conventional plasma CVD method employing TEOS as a material and using ozone ($O_3$).

In the following step, a ferroelectric capacitor structure 40 is formed on the first insulating layer 30 in the memory cell array region 1 by a conventional method.

Particularly, a bottom electrode 42, a ferroelectric layer 44 and a top electrode 46 are sequentially grown according to a conventional method using the previously described layer material such as SBT.

Subsequently, a second insulating layer 50 is grown. The second insulating layer 50 is formed over the memory cell array region 1, the logic circuit region 2, the third region 3 and the fourth region 4. That is, the second insulating layer 50 is formed such that it covers the ferroelectric capacitor structure 40. For example, the second insulating layer 50 may take the form of the above-described P-TEOS layer.

In addition, memory cell contact holes 62 (first contact holes 62a and second contact holes 62b) extending to the ferroelectric capacitor structure 40 are formed on a surface 50a of the second insulating layer 50 in the memory cell array region 1 according to a conventional method. Similarly, logic circuit contact holes 66 extending to the logic circuit device 20 are formed on the surface 50a of the second insulating layer 50 in the logic circuit region 2 at the same time.

Subsequently, buried contacts 63, i.e., a memory cell wiring structure, is formed by filling these contact holes 62 with a conductive material such as tungsten (W) according to a conventional method. Logic circuit buried contacts 67 are formed in a similar fashion.

Next, a first wiring unit 72 is formed to extend over a first portion of surface region 50aa in the second insulating layer 50 of the memory cell array region 1 according to a conventional method. The first wiring unit 72 is formed so as to electrically connect to the memory cell wiring structure 63.

Also, the second wiring unit 74 is formed to extended over a region including a second portion of surface region 50ab in the logic circuit region 2 of the second insulating layer 50, excluding the first portion of surface region 50aa, that is, the second insulating layer 50 formed on the logic circuit region 2, the third region 3 and the fourth region 4.

The second wiring unit 74 is electrically connected to the logic circuit buried contacts 67. Although the first and the second wiring units 72 and 74 are not electrically connected to each other in the wiring layer 70, they are formed on the same plane of the second insulating layer 50, i.e., the surface 50a, as the wiring layer 70.

Specifically, the first and the second wiring units 72 and 74 are formed in the same plane the second insulating layer 50, that is, on the surface 50a, according to a conventional method using aluminum (Al) and copper (Cu).

Thereafter, a liner oxide layer 80 is formed (see FIG. 2B). The liner oxide layer 80 is formed on a region including the logic circuit region 2 formed over the second wiring unit 74, excluding the first portion of surface region 50aa, i.e., on the second insulating layer 50 in the logic circuit region 2, the third region 3 and the fourth region 4. In other words, the liner oxide layer 80 is formed as a pattern exposing only the memory cell array region 1.

Specifically, a mask pattern 82 covering the memory cell array region 1, present in the form of a matrix, is formed on the wafer 11 (see FIG. 3B).

The mask pattern 82 is formed, e.g., by patterning the resist layer grown with any appropriate material using conventional photolithography and etching processes.

In the next step, the liner oxide layer 80, i.e., a P-TBOS layer is grown on the whole surface of the semiconductor substrate 11 by masking the mask pattern 82.

In the following step, the mask pattern 82 is removed and the liner oxide layer 80 including a pattern covering the logic circuit region 2, the third region 3 and the fourth region 4, i.e., exposing the memory cell array region 1.

In the subsequent step, for example, a thin film cover layer 90 is grown of a material such as alumina ($Al_2O_3$) and silicon nitride (SiN) according to a conventional method. The cover layer 90 is formed over the entire upper surface of the semiconductor substrate 11, i.e., the memory cell array region 1 formed over the first wiring unit 72, the logic circuit region 2, the third region 3 and the fourth region 4 formed over the liner oxide layer 80.

A multi-layer wiring structure may be formed, wherein the multi-layer wiring structure includes the wiring layer 70 as a first wiring layer, a second wiring layer and a third wiring layer obtained, for example, by forming via holes through both or any one of the liner oxide layer 80 and the cover layer 90 above the wiring layer 70 and electrically connecting to the wiring layer 70 (not shown).

Subsequently, the semiconductor substrate 11 is divided into a plurality of wafer pieces by dicing along a scribe line Li using a conventional dicing device.

In this fashion, a so-called chip type semiconductor is obtained and a plurality of hybrid memory devices 100, each having the same structure, is formed on one semiconductor substrate 11.

According to this exemplary manufacturing method, during the formation of the cover layer 90, the first wiring unit 72 is not connected to the gate electrode of the transistor present in the memory cell array region 1, and also, the liner oxide layer 80 is formed on the second wiring unit 74. Therefore, charge up of the second wiring unit 74 is effectively prevented. Therefore, breakdown of the gate oxide layer of the transistor connected to the second wiring unit 74 is prevented. Accordingly, deterioration of electrical characteristics of the transistors provided in the devices used in the manufacturing processes can be effectively prevented.

Second Embodiment

Construction of the Hybrid Memory Device

Referring to FIG. 4, one example of a hybrid memory device of the present invention will be described.

Figure 4A:
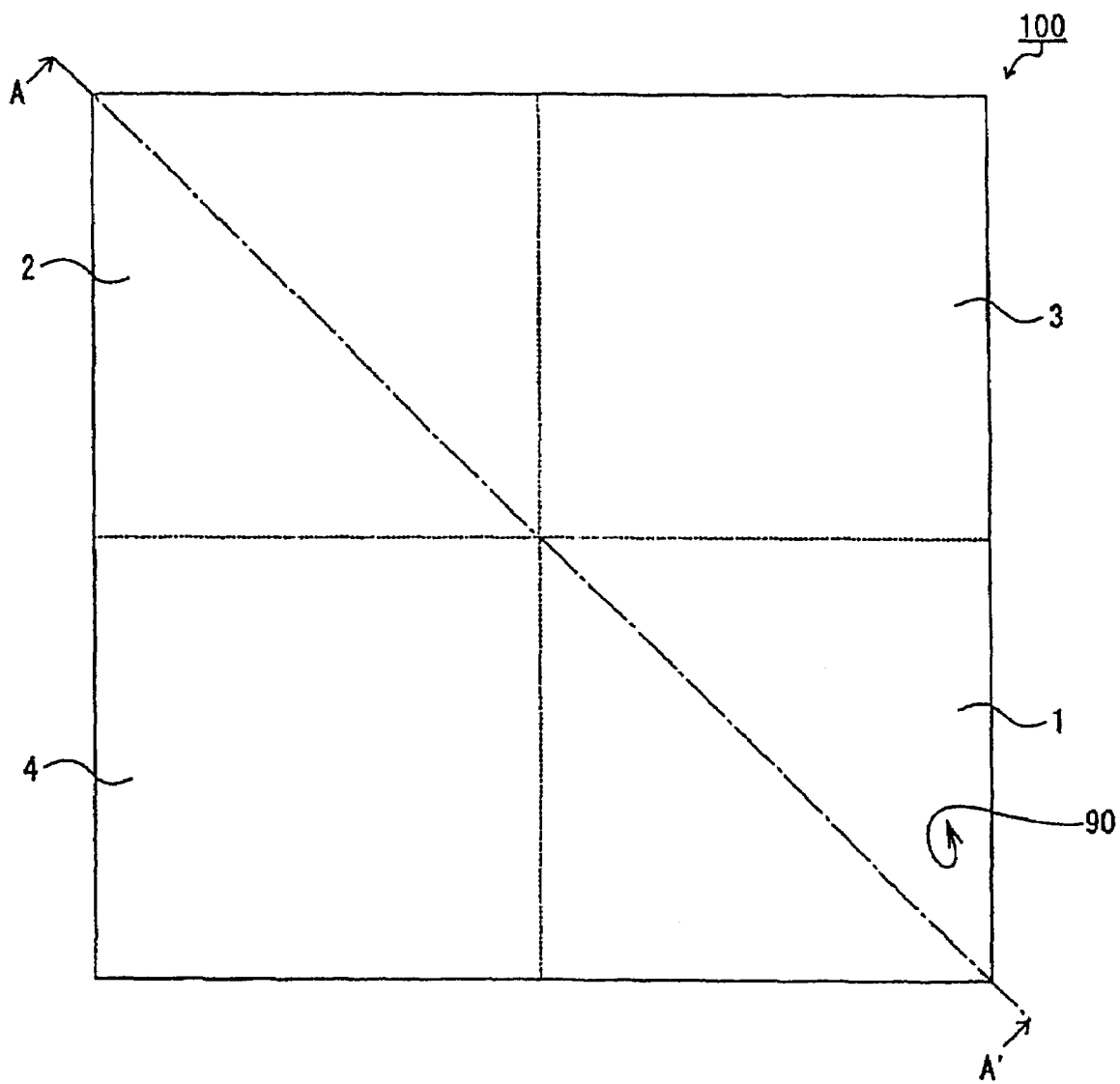
FIG. 4A is a schematic top view explaining elements of an example of a hybrid memory device in accordance with a second embodiment of the present invention.

FIG. 4A is a schematic top view explaining elements of an example of the present hybrid memory device. FIG. 4B is a schematic view representing a cross-section taken along dash dotted line A-A' of FIG. 4A.

The hybrid memory device 100 is characterized in that it includes an offset oxide layer 81 formed on the first wiring unit 72. As for the other elements, since they are similar to those of the first embodiment, a detailed explanation thereof is omitted.

As shown in FIGS. 4A and 4B, the hybrid memory device 100 in accordance with a second embodiment of the present invention is a type of so-called (semiconductor) chip.

The hybrid memory device 100 is provided with a semiconductor substrate 11. In the semiconductor substrate 11, a plurality of regions is defined. Similar to the first embodiment, a memory cell array region 1, a logic circuit region 2, a third region 3 and a fourth region 4 adjacent to the memory cell array region 1 are divided into a matrix.

A memory cell device 10 is disposed in the memory cell array region us disposed. In addition, a logic circuit device 20 is disposed in the logic circuit region 2 is disposed. The memory cell device 10 and the logic circuit device 20 are separated from each other by a device isolation structure, e.g., a field oxide layer 5, formed by a conventional device isolation process such as the LOCOS method.

The memory cell array region 1 is adjacent to the logic circuit region 2, the third region 3 and the fourth region 4, respectively. In the memory cell array region 1, a plurality of memory cells including a ferroelectric layer and a memory cell device to be described hereinafter is arranged in the form of matrix.

The memory cell device 10 includes a device such as a transistor having a conventional construction. For example, the memory cell device 10 includes a memory diffusion region 12, a memory cell gate insulating layer (gate oxide layer) 14 and a memory cell gate electrode 16 formed on the memory cell gate insulating layer 14 as constitutional elements of the transistor.

The logic circuit region 2 is positioned adjacent to the memory cell array region 1, the third region 3 and the fourth region 4, respectively. The logic circuit device 20 is formed in the logic circuit region 2.

The logic circuit device 20, similar to the memory cell device 10, includes a device such as a transistor. The logic circuit device 20 includes a decoder circuit or the like, wherein the decoder circuit controls the operation of the memory cell by connection to the memory cell array.

The logic circuit device 20, for example, as constitutional elements of transistors, includes a logic circuit diffusion region 22, a logic circuit device gate insulating layer 24 and a logic circuit device gate electrode 26 formed on the logic circuit device gate insulating layer 24.

Any suitable devices or circuits may be placed in the third region 3 and the fourth region 4. Preferably, an I/O circuit, an analog circuit, an RF circuit and so called microcomputer are disposed on the third region 3 and the fourth region 4.

A first insulating layer 30 is formed on the top of the memory cell array region 1 on which the memory cell device 10 is formed and the top of the logic circuit region 2 on which the logic circuit device 20 is formed. That is, the first insulating layer 30 is disposed on the entire top surface of the semiconductor substrate 11 where the memory cell device 10 and the logic circuit device 20 are formed.

A ferroelectric capacitor structure 40 is disposed on the first insulating layer 30 in the memory cell array region us disposed. The ferroelectric capacitor structure 40 consists of a sequentially stacked bottom electrode 42, a ferroelectric layer 44 and a top electrode 46.

The second insulating layer 50 is formed over the entire surface of the first insulating layer 30 50 as to cover the ferroelectric capacitor structure 40. That is, the second insulating layer 50 is formed over the memory cell region 1, the logic circuit region 2, the third region 3 and the fourth region 4.

Memory cell contact holes 62 (62a: first contact holes, 62b: second contact holes) and logic circuit contact holes 66 are formed in the second insulating layer 50.

The first contact holes 62a formed in the memory cell array region 1 are formed from a surface 50a of the second insulating layer 50 to the ferroelectric capacitor structure 40.

Meanwhile, the second contact holes 62b are also formed in the memory cell array region 1 and are extended from the surface 50a of the second insulating layer 50 to the memory cell device 10.

Preferably, the memory cell contact holes 62 (the first and the second contact holes 62a and 62b) are formed into buried contacts 63 by filling them with a conductive material such as tungsten (W). Such buried contacts may also be generally referred to as a memory cell wiring structure.

The logic circuit contact holes 66 may also be referred to as third contact holes. The third contact holes 66 are formed in the logic circuit region 2. The third contact holes 66 are opened from the surface 50a of the second insulating layer 50 to the logic circuit device 20. The third contact holes 66 are formed into logic circuit buried contacts 67 by being filled with a conductive material such as tungsten. Such buried contacts may also be generally referred to as a peripheral wiring structure.

A first wiring unit 72 and a second wiring unit 74 are formed as a wiring layer 70 in the surface 50a (i.e., the top surface) of the second insulating layer 50 where the buried contact holes 63 and logic circuit buried contacts 67 are formed.

The first wiring unit 72 is formed to extend over a first portion of surface region 50aa in the memory cell array region 1 of the second insulating layer 50. The first wiring unit 72 is electrically connected to the memory cell wiring structure 63.

On the other hand, the second wiring unit 74 is formed to extend over a region including a second portion of surface region 50ab in the logic circuit region 2 except the first portion of surface region 50aa, that is, the second insulating layer 50 formed on the logic circuit region 2, the third region and the fourth region 4.

The second wiring unit 74 is electrically connected to the logic circuit buried contact 67. Likewise, the first and the second wiring units 72 and 74 are formed on the same plane of the second insulating layer 50, i.e., the surface 50a, as the wiring layer 70.

Also, the first and the second wiring units 72 and 74 are not electrically connected to each other.

An offset oxide layer 81 is formed on the first wiring unit 72. The offset oxide layer 81 exposes sides 72b, while covering a top surface 72a of the first wiring unit 72. It is preferable that the offset oxide layer 81 be made of; e.g., P-TEOS layer.

A liner oxide layer 80 is formed on the second insulating layer 50 of the logic circuit region 2 where the second wiring unit 74 is formed. The liner oxide layer 80 is formed as a layer pattern covering the second wiring unit 74, i.e., covering the logic circuit region 2, the third region 3 and the fourth region 4, while exposing the memory cell array region 1. For example, it is preferably that the liner oxide layer 80 be a P-TEOS layer.

Further, a cover layer 90 is formed over the entire upper surface of the second insulating layer 50 where the above-described wiring layer 70 (the first wiring unit 72 and the second wiring unit 74) and the liner oxide layer 80 are formed. That is, the cover layer 90 is formed to extended over the entire top surface of the logic circuit region 2, the third region 3 and the fourth region 4 where the liner oxide layer 80 is formed and the second insulating layer 50 of the memory cell array region 1 where the offset oxide layer 81 and the first wiring unit 72 are formed. Preferably, a thin layer formed of alumina ($Al_2O_3$), silicon nitride (SiN), or the like may be employed as the cover layer 90.

A multi-layer wiring structure may be provided, wherein the multi-layer wiring structure includes the wiring layer 70 as a first wiring layer, a second wiring layer and a third wiring layer obtained, for example, by forming via holes through both or any one of the liner oxide layer 80 and the cover layer 90 above the first wiring layer 70 and electrically connected to the wiring layer 70. However, since this configuration does not fall within the scope of the present invention, an illustration and a detailed explanation thereof are omitted.

Furthermore, in this embodiment, gate electrodes of a selective transistor corresponding to the memory cell device 10 formed on the memory cell array region 1 are not connected to the first wiring unit 72 of the wiring layer 70. That is, the gate electrodes of the selective transistor connected to the ferroelectric capacitor structure 40 are connected to the first wiring unit 72 by inserting a second wiring layer and a third wiring layer (not shown) located above the wiring layer 70. Specifically, all of the buried contacts 63 connected to the first wiring unit 72 in the memory cell array region 1 are connected to the memory cell diffusion region 12.

The hybrid memory device 100 according to the example, similar to the first embodiment, is capable of preventing deterioration of the withstand voltage of the transistor disposed at the to logic circuit unit 2. Further, since the offset oxide layer 81 is formed on the first wiring unit 72, it can prevent charge up of the first wiring unit 72 more effectively. Therefore, in comparison with the first embodiment, the present invention is capable of improving the withstand voltage of the transistor present in the memory cell array region.

Manufacturing Method of the Hybrid Memory Device

Subsequently, referring to FIGS. 5 and 6, an exemplary method of manufacturing the hybrid memory device 100 including the above-described constitutional elements will be described in accordance with the second embodiment.

Furthermore, as described above, unique features of the exemplary method of manufacturing the hybrid memory device include the process of forming the wiring layer and the following processes. Accordingly since all other processes, aside from the above mentioned processes, are identical to those of the first embodiment, a detailed description thereof will be omitted herein.

As for the plan view, since it is similar to that of the first embodiment shown in FIG. 3A, the second embodiment is explained only by showing the schematic diagram representing the cross-section equal to FIG. 3B to avoid complicating drawings.

Figure 5A:
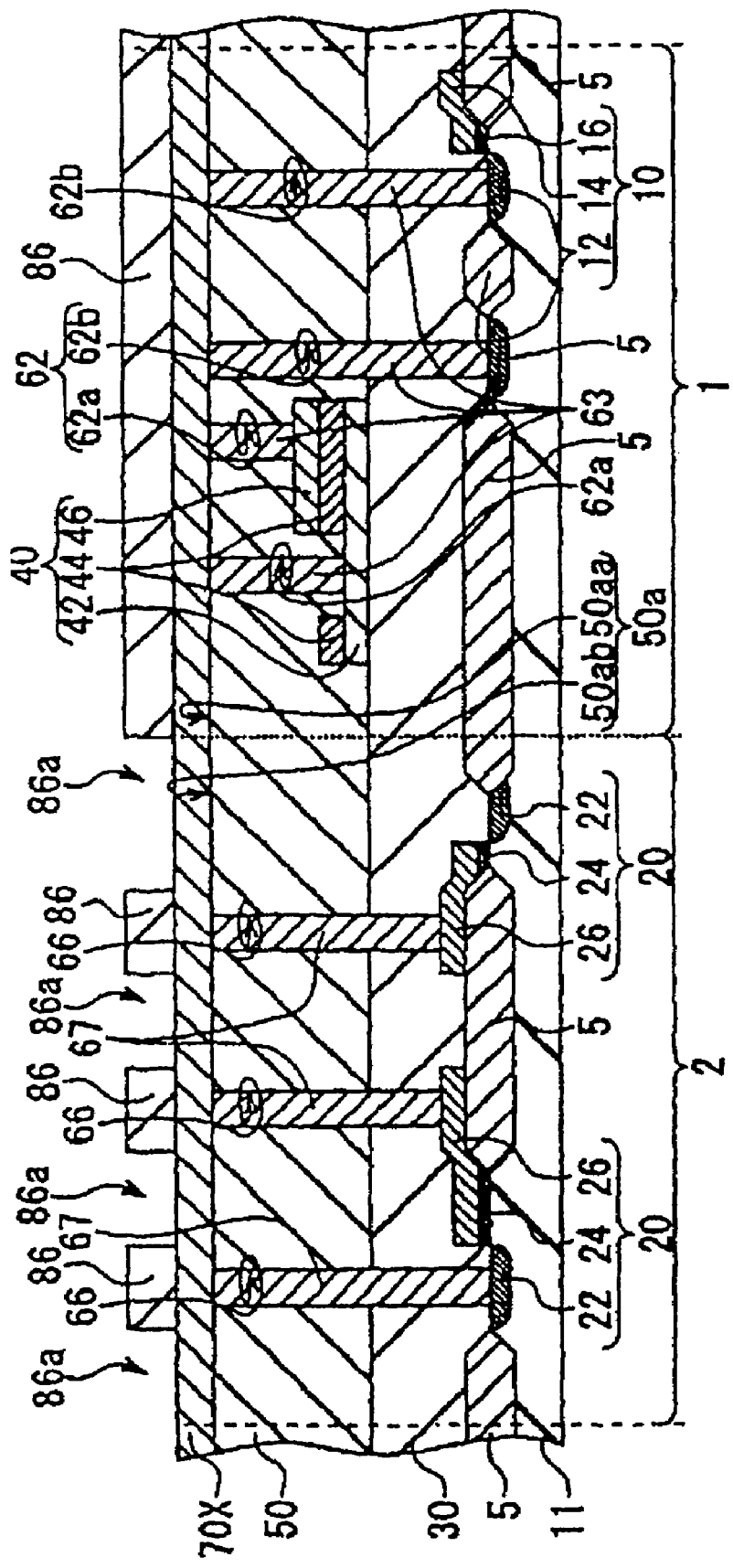
FIGS. 5A to 5C are explanatory diagrams of manufacturing processes illustrating cross-sections of the hybrid memory device during the manufacturing process at a wafer level taken along dash dotted line A-A' of FIG. 3A.
Figure 5B:
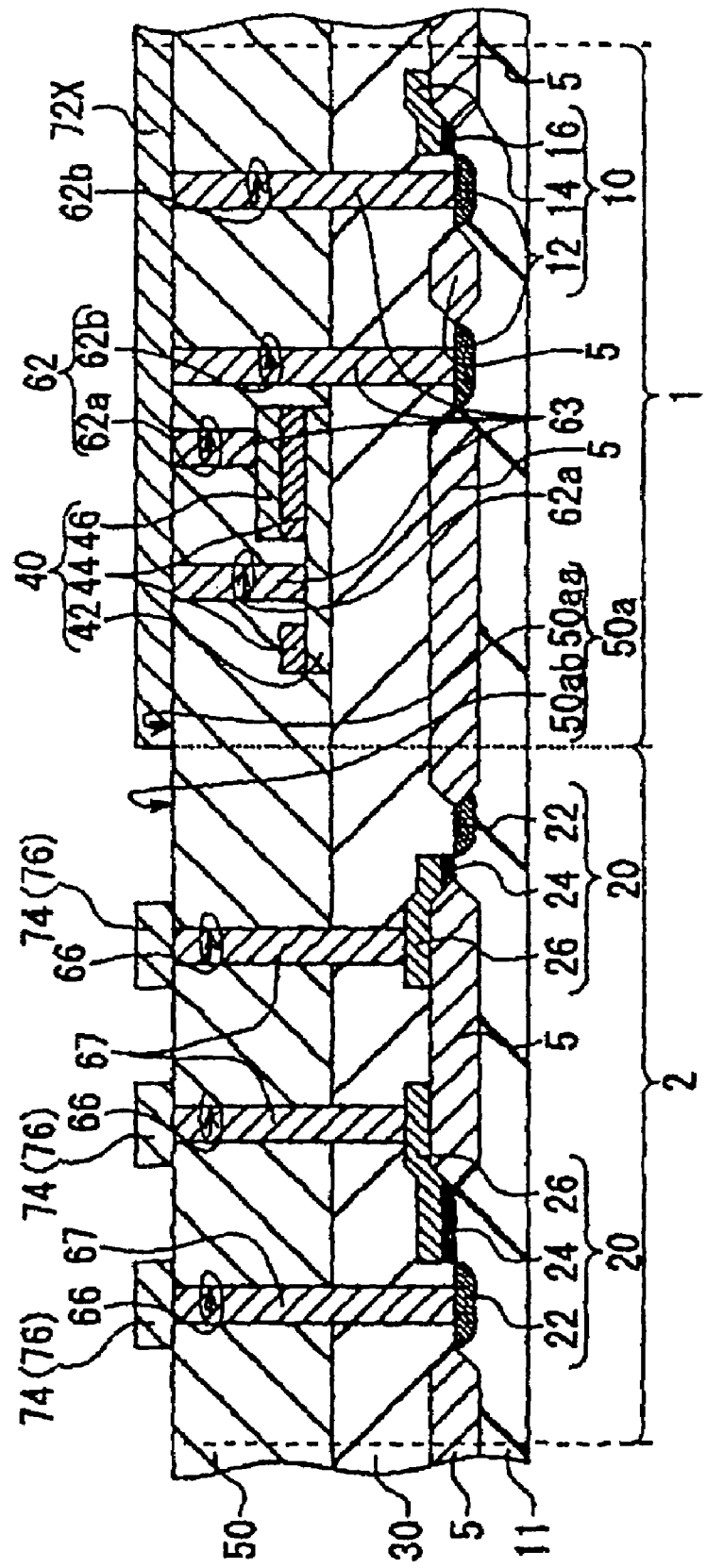
Figure 5C:
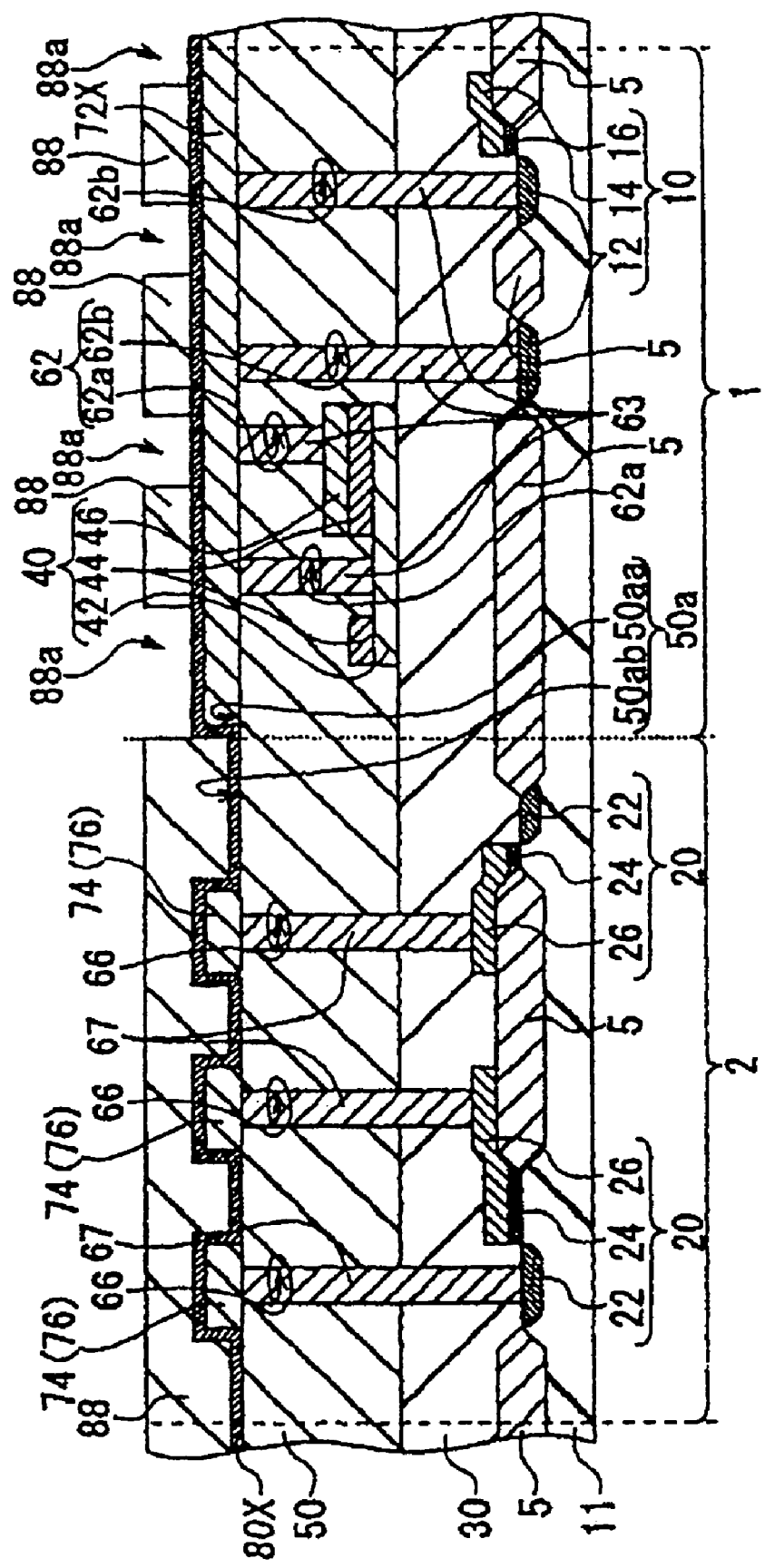

FIGS. 5A to 5C are explanatory diagrams of schematic manufacturing processes illustrating cross-sections of the hybrid memory device during the manufacturing process at a wafer level taken along dash dotted line A-A' of FIG. 3A.

Figure 6A:
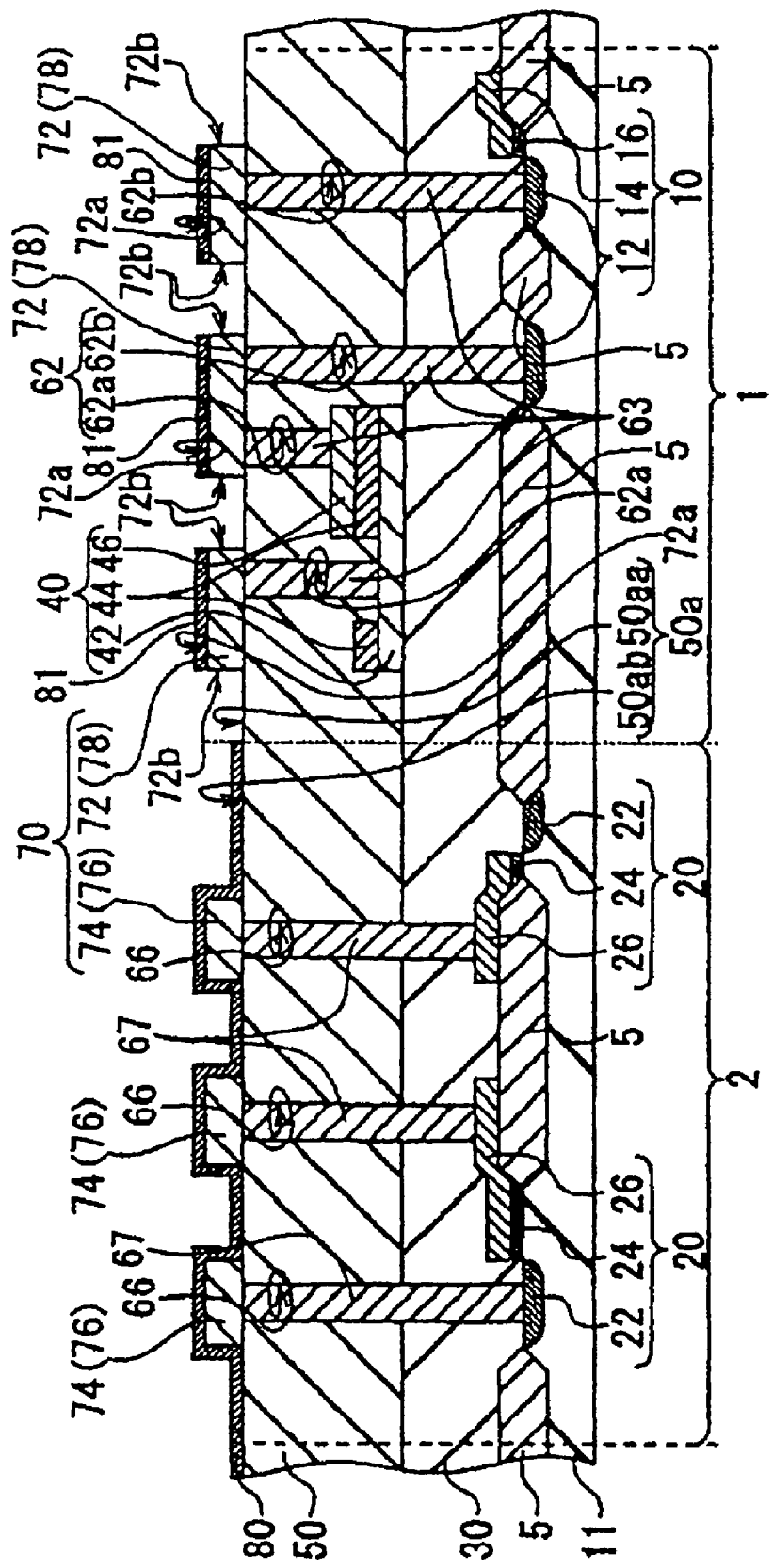
Figure 6C:
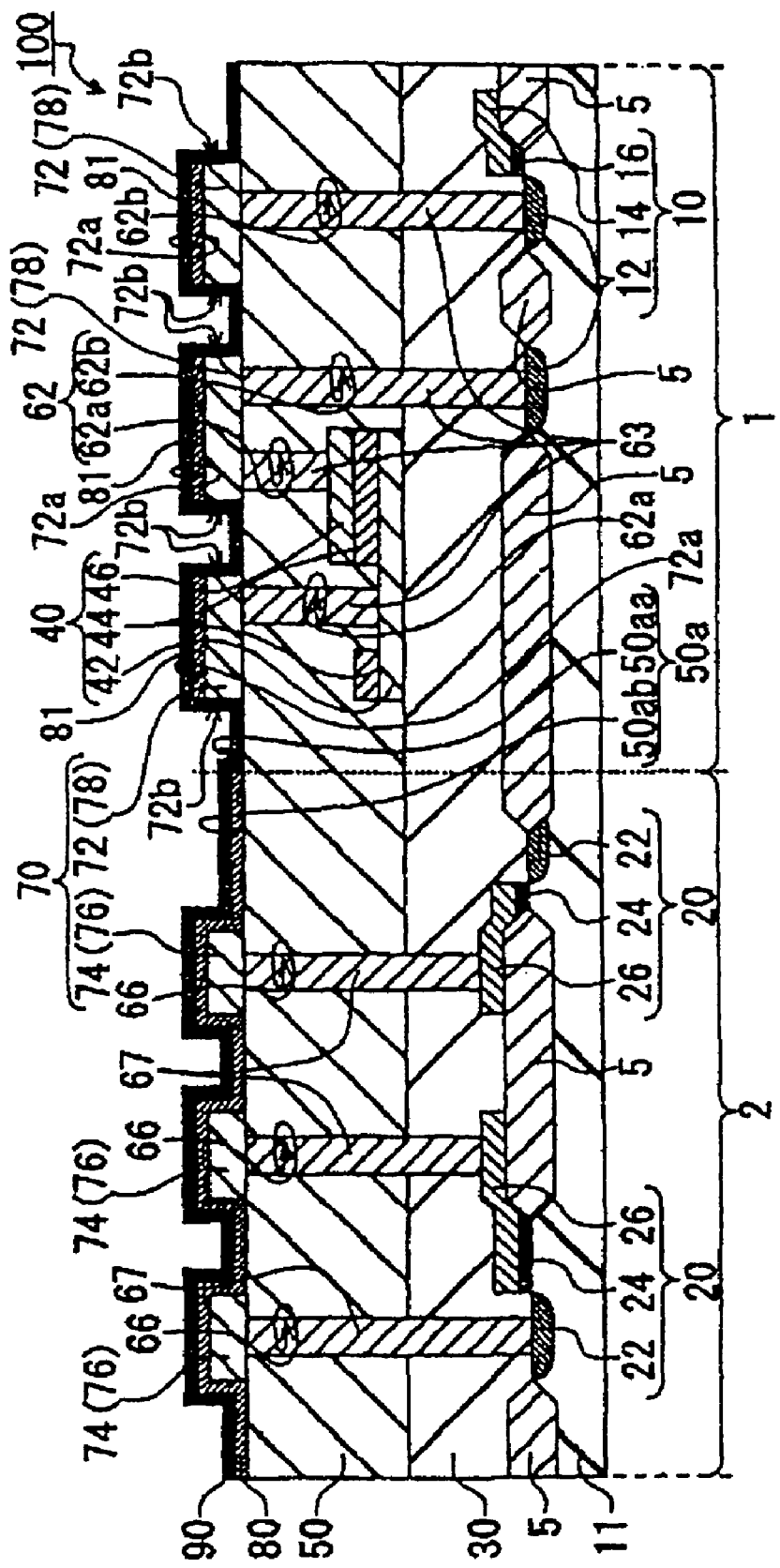

FIGS. 6A to 6C are explanatory diagrams of manufacturing processes following FIGS. 5A to 5C.

Firstly, a plurality of sets is arranged in the form of matrix in the semiconductor substrate (wafer) 11 by forming a memory cell array region 1, a logic circuit region 2, a third region 3 and a fourth region 4 adjacent to the memory cell array region 1 into one set.

In the memory cell array region 1 of the semiconductor substrate 11, a memory cell device 10 is formed in response to a conventional wafer process. In addition, in the logic circuit region 2, a logic circuit device 20 is formed similarly. For example, a field oxide layer 5, i.e., a device isolation structure is formed by the LOCOS method.

Subsequently, the memory cell device 10 including a device such as a transistor provided with a memory cell diffusion region 12, a memory cell gate insulating layer 14 and a memory cell gate electrode 16 formed on the memory cell gate insulating layer 14 is formed on the memory cell array region 1. In addition, the logic circuit device 20 is similarly formed on the logic circuit device region at the same time.

In the next step, a first insulating layer 30 is grown on the exposed surface of the semiconductor substrate 11, that is, on the memory cell array region 1 formed thereon the memory cell device 10 and on the logic circuit region 2 formed thereon the logic circuit device 20 as the whole top surface of the semiconductor substrate 11.

In the following step, a ferroelectric capacitor structure 40 is formed on the first insulating layer 30 in the memory cell array region 1 by a conventional method.

Particularly, a bottom electrode 42, a ferroelectric layer 44 and a top electrode 46 are sequentially grown, according to a conventional method, using the previously described layer material such as SBT.

Subsequently, a second insulating layer 50 is grown. The second insulating layer 50 is formed over the memory cell array region 1, the logic circuit region 2, the third region 3 and the fourth region 4. That is, the second insulating layer 50 is formed in such a way that it covers the ferroelectric capacitor structure 40.

In addition, memory cell contact holes 62 (first contact holes 62a and second contact holes 62b) extending to the ferroelectric capacitor structure 40 are formed on a surface 50a of the second insulating layer 50 in the memory cell array region 1 according to a conventional method. Similarly, logic circuit contact holes 66 extending to the logic circuit device 20 are formed on the surface 50a of the second insulating layer 50 in the logic circuit region 2 at the same time.

Sequentially, buried contacts 63, i.e., a memory cell wiring structure, are formed by filling the contact holes 62 with a conductive material such as tungsten (W) according to a conventional method. Similarly, logic circuit buried contacts 67 are formed.

Next, the wiring layer 70, i.e., the first and the second wiring units 72 and 74, is formed. In this example, these first and second wiring units 72 and 74 are formed together with the offset oxide layer 81 formed on a top surface 72a of the first wiring unit 72 and the liner oxide layer 80 formed to cover the second wiring unit 74.

As shown in FIG. 5A, at first, a metal layer 70X is formed on the entire top surface of the second insulating layer 50, that is, on the first memory cell array region 1, the logic circuit region 2, the third region 3 and the fourth region 4 of the second insulating layer 50. The formation process of the metal layer 70X is performed, for example, by a deposition process with the sputter under appropriate conditions, using aluminum (Al); copper (Cu), an alloy thereof, or the like as a material of the metal layer 70X.

Thereafter, a first photoresist pattern 86 is formed according to a conventional photolithography process. For example, in the photolithography process, THMR-iP series (Trade Mark) manufactured by Tokyo Ohika Co., Ltd. may be employed as a resist material.

The first photoresist pattern 86 is formed such that it covers the entire surface of the metal layer 70X in the memory cell array region 1.

In addition, the first photoresist pattern 86 is formed on the logic circuit region 2, the third region 3 and the fourth region 4 as a pattern having a first open unit 86a of any appropriate pattern to form the wiring pattern.

In the following step, utilizing the first photoresist pattern 86 as a mask performs a step of etching. This etching process employs a conventional etching apparatus and it is preferable that it be performed, for example, by a dry etching process implemented under the condition that a flow rate ratio of a gas is $BCl_3$:40 sccm/$Cl_2$:60 sccm, pressure is 1.0 Pa (Pascal) and power is 70 W (Watts).

In the next step, the first photoresist pattern 86 is removed by performing a conventional etching process.

In this fashion, the first wiring pattern 76 including the second wiring unit 74 and extending over the logic circuit region 2 is formed as shown in FIG. 5B. Furthermore, wiring units (not shown) are formed on the third region 3 and the fourth region 4 together with the second wiring unit 74 by this process. These not-shown wiring units are also included in the first wiring pattern 76.

In addition, on the second insulating layer 50 in the memory cell array region 1, the first wiring unit 72X is formed as a precursor covering the whole surface thereof.

Subsequently, as shown in FIG. 5C, the precursor liner oxide layer 80X is formed over the first wiring pattern 76, the second insulating layer of the logic circuit region 2 and the metal layer of the memory cell array region 1, i.e., extending over the first precursor wiring unit 72X. Herein, the first precursor wiring unit 72X indicates a layer that will be formed into the first wiring unit through a patterning process to be described hereinafter. In addition, the precursor liner oxide layer 80X indicates a layer that will be formed into the liner oxide layer through a patterning process to be described hereinafter.

In the next step, a second resist pattern 88 is formed to pattern the precursor liner oxide layer 80X and the second wiring pattern. The second resist pattern 88 can be formed using the same resist material of the above-described first resist pattern 86.

Specifically, the second resist pattern 88 covers the whole surface of the precursor liner oxide layer 80X except for the memory cell array region 1 and is formed as a pattern provided with a second open portion 88a to form the wiring pattern on the precursor liner oxide layer 80X of the memory cell array region 1.

Etching is performed using the second resist pattern 88 as a mask.

Herein, two steps of etching processes are performed. Firstly, etching of the precursor liner oxide layer 80X exposed from the second resist pattern 88 is performed as a first step.

Particularly, this etching process employs a conventional etching apparatus and it is preferable that it be performed, for example, by a dry etching process implemented under the conditions that a flow rate ratio of a gas is $C_4F_8$:15 sccm/Ar: 200 sccm/$O_2$:8 sccm, pressure is 40 mTorr (5.33 Pa) and power is 300 Watts.

As the second step of etching, the first precursor wiring unit 72X exposed using the second photoresist pattern 88 as a mask is patterned into the second wiring pattern 78 including the first wiring unit 72 under the same etching conditions as the above-described etching conditions of the first wiring pattern 76.

In the ensuing step, the second resist pattern 88 is removed by an ashing process according to a conventional method.

As shown in FIG. 6A, by these two steps of etching processes, the second wiring unit 74, i.e., the liner oxide layer 80 covering the whole surface of the first wiring pattern 76, the second wiring pattern 78 including the first wiring unit 72 and the offset oxide layer 81 covering the top surface 72a of the first wiring unit 72 and exposing sides 72b, is formed.

Through the above processes, the first wiring unit 72 and the second wiring unit 74 are patterned. The first wiring unit 72 is extended to the first portion of surface region 50aa present in the memory cell array region 1 of the second insulating layer 50. The first wiring unit 72 is electrically connected to the memory cell wiring structure 63.

Furthermore, the second wiring unit 74 is formed on a region including the second portion of surface region 50ab in the logic circuit region 2 of the second insulating layer 50 but excluding the first portion of surface region 50aa, i.e., by extending over the second insulating layer 50 in the logic circuit region 2, the third region 3 and the fourth region 4.

The second wiring unit 74 is electrically connected to the logic circuit buried contacts 67. Even if these first and second wiring units 72 and 74 are not connected to each other in the wiring layer 70, they are formed on the same plane of the second insulating layer 50, i.e., on the surface 50a, by the same layer as the wiring layer 70.

Hereinafter, as shown in FIG. 6B, the cover layer 90 is formed.

The cover layer 90 is formed such that it covers the offset oxide layer 81, the sides 72b of the first wiring unit 72, the second insulation layer 50 of the memory cell array region 1 exposed form the first wiring unit 72 and the liner oxide layer 80.

A multi-layer wiring structure may be formed, wherein the multi-layer wiring structure includes the wiring layer 70 as a first wiring layer, a second wiring layer and a third wiring layer obtained, for example, by forming via holes through both or any one of the liner oxide layer 80 or the offset oxide layer 81 and the cover layer 90 above the first wiring layer 70, and electrically connected to the wiring layer 70 (not shown).

Thereafter, as shown in FIG. 6C, upon completion of the above wafer processes, the semiconductor substrate 11 is divided into a plurality of hybrid memory devices 100 by dicing along a scribe line Li using a conventional dicing device.

In this fashion, the plurality of hybrid memory devices 100, each having an identical structure, is manufactured from one semiconductor substrate 11.

Forming Range of the Oxide Layer and the Withstand Voltage of the Transistor

Figure 7:
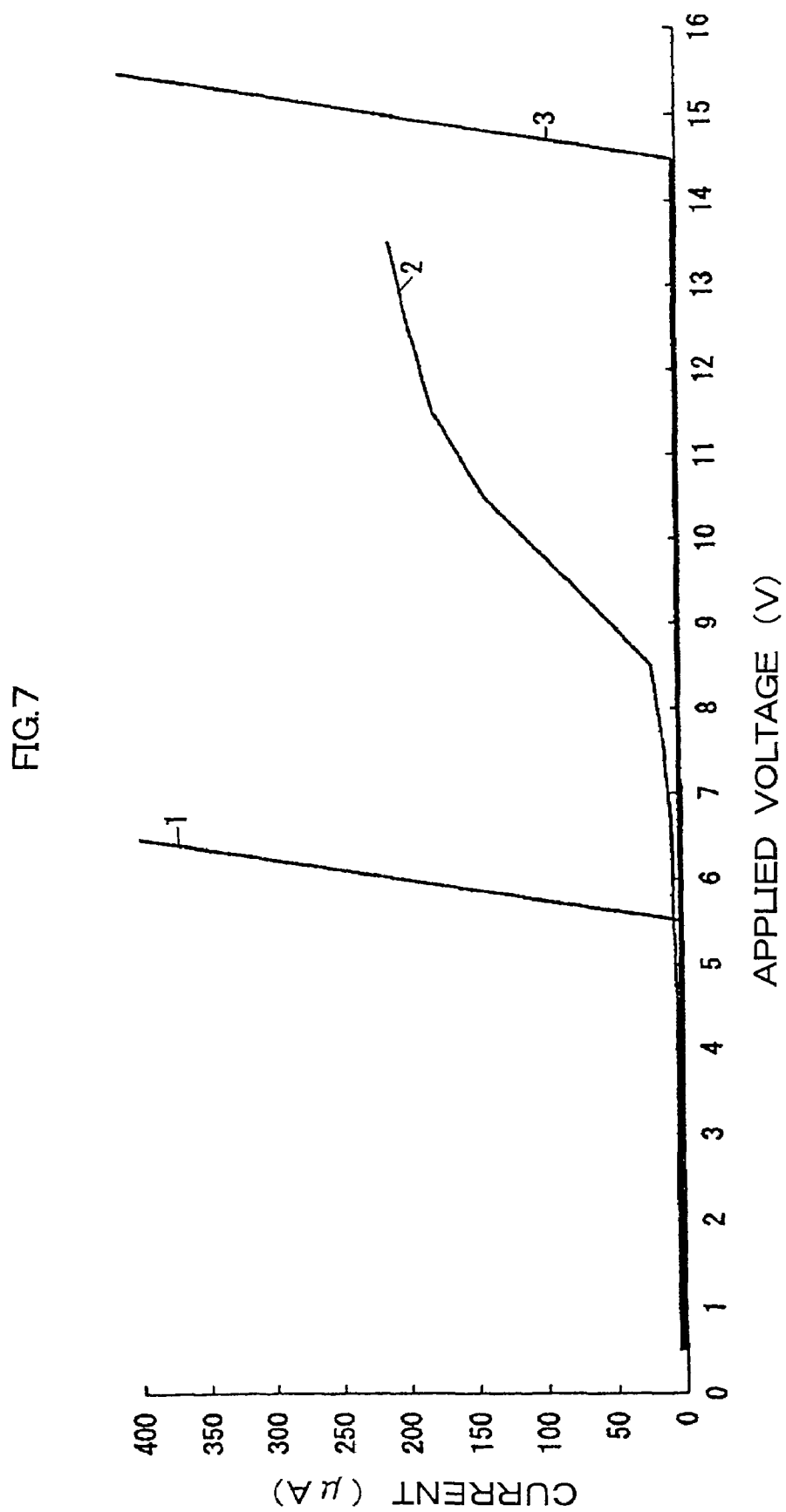
FIG. 7 is a graph explaining withstand voltage characteristics of transistors.

Referring to FIG. 7, the relationship between the forming range of the oxide layer and the withstand voltage of the transistor will now be described.

FIG. 7 is a graph explaining withstand voltage characteristics of transistors. The longitudinal axis represents the applied voltage (V: volt) and the vertical axis represents current (μA: microamperes).

The first line 1 in the graph represents the electrical characteristics of a transistor in which anyone of the offset oxide layer and the liner oxide layer described in the present invention are not formed on the wiring layer connected to the gate electrode of the transistor. That is, when the offset oxide layer and the liner oxide are not disposed on the wiring layer, it is possible to achieve a withstand voltage of 6V as measured via the applied voltage.

The second line 2 in the graph represents the electrical characteristics of a transistor in which the offset oxide layer described in the present invention is formed on the wiring layer connected to the gate electrode of the transistor. That is, when the offset oxide layer is disposed on the wiring layer, it is possible to achieve a withstand voltage of 9V as measured via the applied voltages.

The third line 3 in the graph represents the electrical characteristics of a transistor in which the liner oxide layer described in the present invention is formed on the wiring layer connected to the gate electrode of the transistor. That is, when the liner oxide layer is disposed on the wiring layer, it is possible to achieve a withstand voltage of 15V as measured via the applied voltage.

Referring to the graph, the withstand voltage of the transistor, in which the offset oxide layer is disposed, is higher than that of the transistor in which the offset oxide layer and the liner oxide layer are not disposed, and also, the withstand voltage of the transistor, in which the liner oxide layer is disposed, is higher than that of the transistor in which the offset oxide layer is disposed. In this example, although the construction that the wiring layer is connected to the gate electrode of the transistor has been explained, it is to be understood that the same trend is represented for the withstand voltage of the transistor when the wiring layer is connected to a source or a drain of the transistor, i.e., a diffusion layer.

As a result, in the logic circuit region, since the wiring is directly connected to the gate electrode of the transistor, although the damage due to charge up of the transistor easily occurs, the hydrogen generated by the oxide layer in the logic circuit region and the adverse affects upon the ferroelectric layer by the moisture diffusion are of no concern. Therefore, in the logic circuit region, the liner oxide layer, providing an excellent withstand voltage to the transistor, is utilized.

Furthermore, in the memory cell array region, since the wiring is not directly connected to the gate electrode of the transistor, even if it is difficult to generate the damage due to the charge-up of the transistor, the hydrogen generated at the oxide layer in the memory cell array region and the adverse effects upon the ferroelectric layer due to the moisture diffusion are taken into consideration. Therefore, in the memory cell array region, although the construction of forming the offset oxide layer slightly falls behind the construction of forming the liner oxide layer in view of the withstand voltage of the transistor, it can improve the withstand voltage of the transistor in comparison with the construction of not forming the oxide layer and can prevent adverse effects upon the ferroelectric layer due to moisture diffusion.

It is understood that the foregoing description and accompanying drawings set forth the preferred embodiments of the invention at the present time. Various modifications, additions and alternative designs will, of course, become apparent to those skilled in the art in light of the foregoing teachings without departing from the spirit and scope of the disclosed invention. Thus, it should be appreciated that the invention is not limited to the disclosed embodiments but may be practiced within the full scope of the appended claims.

This application is based on a Japanese Patent Application Nos. 2004-276507 and 2005-007077 which are hereby incorporated by reference.

What is claimed is:

1. A hybrid memory device having a plurality of regions on a chip comprising:
    a memory cell array region in which a plurality of memory cells each including a ferroelectric layer are formed in the form of a matrix;
    a logic circuit region including a logic circuit device;
    an insulating layer formed on the memory cell array region and the logic circuit region;
    first wiring units formed on the insulating layer and electrically connected to the memory cells in the memory cell array region;
    second wiring units formed on the insulating layer and electrically connected to the logic circuit device in the logic circuit region;
    a liner oxide layer formed on the insulating layer to cover the second wiring units over the logic circuit region, the liner oxide layer does not cover the memory cell array region; and
    a cover layer formed on the insulating layer to cover the first wiring units and the liner oxide layer.

2. The hybrid memory device as recited in claim 1, wherein the cover layer is selected from a group including an alumina layer and a silicon nitride layer.

3. A hybrid memory device, comprising:
    a semiconductor substrate having a plurality of regions on a chip including a memory cell array region in which a plurality of memory cell devices are formed in the form of a matrix, and a logic circuit region including a logic circuit device;

a first insulating layer formed on the memory cell array region and the logic circuit region;

a ferroelectric capacitor structure formed in the memory cell array region on the first insulating layer and having a bottom electrode, a ferroelectric layer and a top electrode which are formed sequentially stacked;

a second insulating layer formed on the memory cell array region and the logic circuit region and covering the first insulating layer and the ferroelectric capacitor structure;

a memory cell wiring structure formed by filling first contact holes extending from a surface of the second insulating layer to the ferroelectric capacitor structure and second contact holes extending from the surface of the second insulating layer to the memory cell devices with a conductive material;

a peripheral wiring structure formed by burying third contact holes extending from a surface of the second insulating layer to the logic circuit device;

a wiring layer including a first wiring unit extending over the second insulating layer of the memory cell array region, and a second wiring unit extending on the second insulating layer at a region including the logic circuit region and excluding the memory cell array region;

a liner oxide layer formed to expose the first wiring unit and the second insulating layer of the memory cell array region as well as to cover the second insulating layer of the region including the logic circuit region and excluding the memory cell array region and an entire surface of an exposed surface of the second wiring unit; and a cover layer formed to cover the first wiring unit, the second insulating layer of the memory cell array region and the liner oxide layer.

4. The hybrid memory device as recited in claim 3, wherein the first wiring unit further includes an offset oxide layer covering a top surface of the first wiring unit but exposing sides thereof, and wherein the cover layer is formed to cover the offset oxide layer, the sides of the first wiring unit, the second insulating layer of the memory cell array region and the liner oxide layer.

5. The hybrid memory device as recited in claim 3, wherein the cover layer is selected from a group including an alumina layer and a silicon nitride layer.

\* \* \* \* \*